United States Patent
Kogut et al.

(10) Patent No.: US 7,715,079 B2
(45) Date of Patent: May 11, 2010

(54) MEMS DEVICES REQUIRING NO MECHANICAL SUPPORT

(75) Inventors: Lior Kogut, Haifa (IL); Ming-Hau Tung, San Francisco, CA (US); Yeh-Jiun Tung, Sunnyvale, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 11/952,873

(22) Filed: Dec. 7, 2007

(65) Prior Publication Data
US 2009/0147343 A1 Jun. 11, 2009

(51) Int. Cl.
*G02B 26/08* (2006.01)
(52) U.S. Cl. .................. 359/223.1; 359/212.1
(58) Field of Classification Search ............ 359/198, 359/212, 223, 247, 290–292, 295, 198.1, 359/212.1, 223.1
See application file for complete search history.

(56) References Cited

U.S. PATENT DOCUMENTS

| | | | |
|---|---|---|---|
| 3,728,030 A | 4/1973 | Hawes | |
| 3,955,190 A | 5/1976 | Teraishi | |
| 4,403,248 A | 9/1983 | Te Velde | |
| 4,441,791 A | 4/1984 | Hornbeck | |
| 4,786,128 A | 11/1988 | Birnbach | |
| 4,859,060 A | 8/1989 | Katagiri et al. | |
| 4,954,789 A | 9/1990 | Sampsell | |
| 4,956,619 A | 9/1990 | Hornbeck | |
| 4,982,184 A | 1/1991 | Kirkwood | |
| 5,022,745 A | 6/1991 | Zahowski et al. | |
| 5,028,939 A | 7/1991 | Hornbeck et al. | |
| 5,091,983 A | 2/1992 | Lukosz | |
| 5,096,279 A | 3/1992 | Hornbeck et al. | |
| 5,170,283 A | 12/1992 | O'Brien et al. | |
| 5,315,370 A | 5/1994 | Bulow | |
| 5,381,232 A | 1/1995 | Van Wijk | |
| 5,452,138 A | 9/1995 | Mignardi et al. | |
| 5,471,341 A | 11/1995 | Warde et al. | |
| 5,526,172 A | 6/1996 | Kanack | |

(Continued)

FOREIGN PATENT DOCUMENTS

EP 0 668 490 8/1995

(Continued)

OTHER PUBLICATIONS

Pape et al., Characteristics of the deformable mirror device for optical information processing, Optical Engineering, 22(6):676-681, Nov.-Dec. 1983.

(Continued)

*Primary Examiner*—William C Choi
(74) *Attorney, Agent, or Firm*—Knobbe, Martens, Olson & Bear LLP

(57) ABSTRACT

MEMS devices such as interferometric modulators are described having movable layers that are mechanically isolated. The movable layers are electrically attractable such that they can be selectively moved between a top and bottom electrode through application of a voltage. In interferometric modulators, the movable layers are reflective such that an optically resonant cavity is formed between the layer and a partially reflective layer, thereby providing a display pixel that can be turned on or off depending on the distance between the reflective layers in the resonant cavity.

43 Claims, 21 Drawing Sheets

U.S. PATENT DOCUMENTS

| | | |
|---|---|---|
| 5,559,358 A | 9/1996 | Burns et al. |
| 5,636,052 A | 6/1997 | Arney et al. |
| 5,646,729 A | 7/1997 | Koskinen et al. |
| 5,646,768 A | 7/1997 | Kaeiyama |
| 5,661,592 A | 8/1997 | Bornstein et al. |
| 5,665,997 A | 9/1997 | Weaver et al. |
| 5,710,656 A | 1/1998 | Goosen |
| 5,734,177 A | 3/1998 | Sakamoto |
| 5,786,927 A | 7/1998 | Greywall et al. |
| 5,808,781 A | 9/1998 | Arney et al. |
| 5,818,095 A | 10/1998 | Sampsell |
| 5,825,528 A | 10/1998 | Goosen |
| 5,838,484 A | 11/1998 | Goossen et al. |
| 5,867,302 A | 2/1999 | Fleming |
| 5,914,804 A | 6/1999 | Goossen |
| 5,920,418 A | 7/1999 | Shiono et al. |
| 6,028,689 A | 2/2000 | Michalicek et al. |
| 6,040,937 A | 3/2000 | Miles |
| 6,055,090 A | 4/2000 | Miles |
| 6,262,697 B1 | 7/2001 | Stephenson |
| 6,327,071 B1 | 12/2001 | Kimura |
| 6,356,378 B1 | 3/2002 | Huibers |
| 6,384,952 B1 | 5/2002 | Clark et al. |
| 6,433,917 B1 | 8/2002 | Mei et al. |
| 6,438,282 B1 | 8/2002 | Takeda et al. |
| 6,452,712 B2 | 9/2002 | Atobe et al. |
| 6,466,354 B1 | 10/2002 | Gudeman |
| 6,556,338 B2 | 4/2003 | Han et al. |
| 6,574,033 B1 | 6/2003 | Chui et al. |
| 6,597,490 B2 | 7/2003 | Tayebati |
| 6,608,268 B1 | 8/2003 | Goldsmith |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles et al. |
| 6,680,792 B2 | 1/2004 | Miles |
| 6,698,295 B1 | 3/2004 | Sherrer |
| 6,710,908 B2 | 3/2004 | Miles et al. |
| 6,794,119 B2 | 9/2004 | Miles |
| 6,813,059 B2 | 11/2004 | Hunter et al. |
| 6,841,081 B2 | 1/2005 | Chang et al. |
| 6,844,959 B2 | 1/2005 | Huibers et al. |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,980,350 B2 | 12/2005 | Hung et al. |
| 6,982,820 B2 | 1/2006 | Tsai |
| 7,006,272 B2 | 2/2006 | Tsai |
| 7,027,204 B2 | 4/2006 | Trisnadi et al. |
| 7,034,981 B2 | 4/2006 | Makigaki |
| 7,046,422 B2 | 5/2006 | Kimura et al. |
| 7,119,945 B2 | 10/2006 | Kothari et al. |
| 7,123,216 B1 | 10/2006 | Miles |
| 7,126,738 B2 | 10/2006 | Miles |
| 7,130,104 B2 | 10/2006 | Cummings |
| 7,184,195 B2 | 2/2007 | Yang |
| 7,184,202 B2 | 2/2007 | Miles et al. |
| 7,198,973 B2 | 4/2007 | Lin et al. |
| 7,221,495 B2 | 5/2007 | Miles et al. |
| 7,236,284 B2 | 6/2007 | Miles |
| 7,289,259 B2 | 10/2007 | Chui et al. |
| 7,302,157 B2 | 11/2007 | Chui |
| 7,321,456 B2 | 1/2008 | Cummings |
| 7,321,457 B2 | 1/2008 | Heald |
| 7,327,510 B2 | 2/2008 | Cummings et al. |
| 7,372,613 B2 | 5/2008 | Chui et al. |
| 7,372,619 B2 | 5/2008 | Miles |
| 7,385,744 B2 | 6/2008 | Kogut et al. |
| 7,385,762 B2 | 6/2008 | Cummings |
| 7,420,725 B2 | 9/2008 | Kothari |
| 7,629,197 B2 | 12/2009 | Luo et al. |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0024711 A1 | 2/2002 | Miles |
| 2002/0054424 A1 | 5/2002 | Miles |
| 2002/0070931 A1 | 6/2002 | Ishikawa |
| 2002/0075555 A1 | 6/2002 | Miles |
| 2002/0126364 A1 | 9/2002 | Miles |
| 2002/0146200 A1 | 10/2002 | Kurdle et al. |
| 2002/0149828 A1 | 10/2002 | Miles |
| 2003/0016428 A1 | 1/2003 | Kato et al. |
| 2003/0035196 A1 | 2/2003 | Walker |
| 2003/0043157 A1 | 3/2003 | Miles |
| 2003/0053078 A1 | 3/2003 | Missey et al. |
| 2003/0072070 A1 | 4/2003 | Miles |
| 2003/0202265 A1 | 10/2003 | Reboa et al. |
| 2003/0202266 A1 | 10/2003 | Ring et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0051929 A1 | 3/2004 | Sampsell et al. |
| 2004/0058532 A1 | 3/2004 | Miles et al. |
| 2004/0075967 A1 | 4/2004 | Lynch et al. |
| 2004/0076802 A1 | 4/2004 | Tompkin et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0125281 A1 | 7/2004 | Lin et al. |
| 2004/0125282 A1 | 7/2004 | Lin et al. |
| 2004/0145811 A1 | 7/2004 | Lin et al. |
| 2004/0147198 A1 | 7/2004 | Lin et al. |
| 2004/0175577 A1 | 9/2004 | Lin et al. |
| 2004/0184134 A1 | 9/2004 | Makigaki |
| 2004/0207897 A1 | 10/2004 | Lin |
| 2004/0209195 A1 | 10/2004 | Lin |
| 2004/0217919 A1 | 11/2004 | Piehl et al. |
| 2004/0218251 A1 | 11/2004 | Piehl et al. |
| 2004/0240032 A1 | 12/2004 | Miles |
| 2005/0002082 A1 | 1/2005 | Miles |
| 2005/0003667 A1 | 1/2005 | Lin et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0068627 A1 | 3/2005 | Nakamura et al. |
| 2005/0078348 A1 | 4/2005 | Lin |
| 2005/0168849 A1 | 8/2005 | Lin |
| 2005/0179378 A1 | 8/2005 | Oooka et al. |
| 2005/0195462 A1 | 9/2005 | Lin |
| 2005/0241394 A1 | 11/2005 | Clark |
| 2005/0249966 A1 | 11/2005 | Tung et al. |
| 2006/0007517 A1 | 1/2006 | Tsai |
| 2006/0017379 A1 | 1/2006 | Su et al. |
| 2006/0017689 A1 | 1/2006 | Faase et al. |
| 2006/0024880 A1 | 2/2006 | Chui et al. |
| 2006/0065940 A1 | 3/2006 | Kothari |
| 2006/0066599 A1 | 3/2006 | Chui |
| 2006/0066640 A1 | 3/2006 | Kothari et al. |
| 2006/0066641 A1 | 3/2006 | Gally et al. |
| 2006/0066936 A1 | 3/2006 | Chui et al. |
| 2006/0067649 A1 | 3/2006 | Tung et al. |
| 2006/0067651 A1 | 3/2006 | Chui |

| | | | | | | |
|---|---|---|---|---|---|---|
| 2006/0077152 A1 | 4/2006 | Chui et al. | | FR | 2 843 230 | 2/2004 |
| 2006/0077155 A1 | 4/2006 | Chui et al. | | FR | 2 843 230 A1 | 2/2004 |
| 2006/0077156 A1 | 4/2006 | Chui et al. | | JP | 5-49238 | 2/1993 |
| 2006/0077516 A1 | 4/2006 | Kothari | | JP | 5-281479 | 10/1993 |
| 2006/0079048 A1 | 4/2006 | Sampsell | | JP | 11211999 | 8/1999 |
| 2006/0220160 A1 | 10/2006 | Miles | | JP | 2002-062490 | 2/2000 |
| 2006/0262380 A1 | 11/2006 | Miles | | JP | 2001-221913 | 8/2001 |
| 2006/0268388 A1 | 11/2006 | Miles | | JP | 2002-221678 | 8/2002 |
| 2006/0274398 A1 | 12/2006 | Chou | | JP | 2003-340795 | 2/2003 |
| 2007/0020948 A1 | 1/2007 | Piehl et al. | | JP | 2004-012642 | 1/2004 |
| 2007/0077525 A1 | 4/2007 | Davis et al. | | JP | 2004-212638 | 7/2004 |
| 2007/0086078 A1 | 4/2007 | Hagood et al. | | JP | 2004-212680 | 7/2004 |
| 2007/0121118 A1 | 5/2007 | Gally et al. | | JP | 2005 279831 | 10/2005 |
| 2007/0177247 A1 | 8/2007 | Miles | | WO | WO 02/086582 | 10/2002 |
| 2007/0194630 A1 | 8/2007 | Mingard et al. | | WO | WO 02/091060 A2 | 11/2002 |
| 2007/0216987 A1 | 9/2007 | Hagood et al. | | WO | WO 03/079384 | 9/2003 |
| 2007/0279729 A1 | 12/2007 | Kothari et al. | | WO | WO 03/079384 A2 | 9/2003 |
| 2007/0285761 A1 | 12/2007 | Zhong et al. | | WO | WO 2007/053438 | 5/2007 |
| 2008/0013144 A1 | 1/2008 | Chui et al. | | WO | WO 2007/053438 A1 | 5/2007 |
| 2008/0013145 A1 | 1/2008 | Chui et al. | | WO | WO 2007/072998 | 6/2007 |
| 2008/0013154 A1 | 1/2008 | Chui | | WO | WO 2007/075656 | 7/2007 |
| 2008/0037093 A1 | 2/2008 | Miles | | WO | WO 2007/075656 A1 | 7/2007 |
| 2008/0055705 A1 | 3/2008 | Kothari | | | | |
| 2008/0055706 A1 | 3/2008 | Chui et al. | | | | |
| 2008/0055707 A1 | 3/2008 | Kogut et al. | | | | |
| 2008/0080043 A1 | 4/2008 | Chui et al. | | | | |
| 2008/0088904 A1 | 4/2008 | Miles | | | | |
| 2008/0088910 A1 | 4/2008 | Miles | | | | |
| 2008/0088911 A1 | 4/2008 | Miles | | | | |
| 2008/0088912 A1 | 4/2008 | Miles | | | | |
| 2008/0094690 A1 | 4/2008 | Luo et al. | | | | |
| 2008/0106782 A1 | 5/2008 | Miles | | | | |
| 2008/0110855 A1 | 5/2008 | Cummings | | | | |
| 2008/0112035 A1 | 5/2008 | Cummings | | | | |
| 2008/0112036 A1 | 5/2008 | Cummings | | | | |
| 2008/0186581 A1 | 8/2008 | Bita et al. | | | | |
| 2008/0239455 A1 | 10/2008 | Kogut et al. | | | | |
| 2008/0247028 A1 | 10/2008 | Chui et al. | | | | |
| 2008/0278787 A1 | 11/2008 | Sasagawa | | | | |
| 2008/0278788 A1 | 11/2008 | Sasagawa | | | | |
| 2008/0316566 A1 | 12/2008 | Lan | | | | |
| 2008/0316568 A1 | 12/2008 | Griffiths et al. | | | | |
| 2009/0009845 A1 | 1/2009 | Endisch et al. | | | | |
| 2009/0068781 A1 | 3/2009 | Tung et al. | | | | |
| 2009/0073534 A1 | 3/2009 | Lee et al. | | | | |
| 2009/0073539 A1 | 3/2009 | Mignard | | | | |
| 2009/0080060 A1 | 3/2009 | Sampsell et al. | | | | |
| 2009/0103166 A1 | 4/2009 | Khazeni et al. | | | | |
| 2009/0135465 A1 | 5/2009 | Chui | | | | |
| 2009/0201566 A1 | 8/2009 | Kothari | | | | |
| 2009/0213450 A1 | 8/2009 | Sampsell | | | | |
| 2009/0213451 A1 | 8/2009 | Tung et al. | | | | |
| 2009/0256218 A1 | 10/2009 | Mignard et al. | | | | |
| 2009/0273823 A1 | 11/2009 | Tung et al. | | | | |
| 2009/0273824 A1 | 11/2009 | Sasagawa | | | | |
| 2009/0279162 A1 | 11/2009 | Chui | | | | |

FOREIGN PATENT DOCUMENTS

| | | |
|---|---|---|
| EP | 1 122 577 | 8/2001 |
| EP | 1 227 346 | 7/2002 |
| EP | 1 275 997 | 1/2003 |
| EP | 1 473 581 | 11/2004 |

OTHER PUBLICATIONS

Kowarz et al., Conformal grating electromechanical system (GEMS) for high-speed digital light modulation, Proceedings of the IEEE 15th. Annual International Conference on Micro Electro Mechanical Systems, MEMS 2002, pp. 568-573.

Miles, Interferometric modulation: MOEMS as an enabling technology for high performance reflective displays, Proceedings of SPIE, vol. 4985, pp. 131-139, 2003.

PCT Invitation to Pay Additional Fees and, Where Applicable, Protest Fee, International Application No. PCT/US2008/084979, mailed Mar. 17, 2009.

Conner, "Hybrid Color Display Using Optical Interference Filter Array," SID Digest, pp. 577-580 (1993).

Feenstra et al., Electrowetting displays, Liquivista BV, 16 pp., Jan. 2006.

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.

Lezec, Submicrometer dimple array based interference color field displays and sensors, Nano Lett. 7(2):329-333, Dec. 23, 2006.

Miles, Mark, W., "A New Reflective FPD Technology Using Interferometric Modulation", The Proceedings of the Society for Information Display (May 11-16, 1997).

Taii et al., "A transparent sheet display by plastic MEMS," Journal of the SID 14(8):735-741, 2006.

PCT Written Opinion of the International Searching Authority, International Application No. PCT/US2008/084979, mailed May 19, 2009.

Invitation to Pay Additional Fees dated Mar. 17, 2009 for PCT/US08/084979.

ISR and WO dated May 19, 2009 for PCT/US08/084979.

Longhurst, 1963, Chapter IX: Multiple Beam Interferometry, in Geometrical and Physical Optics, pp. 153-157.

Tolansky, 1948, Chapter II: Multiple-Beam Interference, in Multiple-bean Interferometry of Surfaces and Films, Oxford at the Clarendon Press, pp. 8-11.

MEMS DEVICES REQUIRING NO MECHANICAL SUPPORT

FIELD OF THE INVENTION

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

One embodiment disclosed herein includes an electromechanical device including a first electrode, a second electrode, where a gap is present between the first and second electrodes, and a mechanically isolated electrically attractable member positioned within the gap, wherein the electrically attractable member is movable within the gap between a first position closer to the first electrode than the second electrode and a second position closer to the second electrode than the first electrode.

Another embodiment disclosed herein includes a method of moving an electrically attractable member between two positions in an electromechanical device, the method comprising providing an electrically attractable member in contact with a first electrode, applying a first voltage between a second electrode and the electrically attractable member such that the electrically attractable member moves toward the second electrode, and breaking contact between the electrically attractable member and the first electrode in such a way that the electrically attractable member retains enough charge to continue moving toward the second electrode.

Another embodiment disclosed herein includes a method of tilting the electrically attractable member in the electromechanical device, the electromechanical device that has a first electrode, a second electrode, where a gap is present between the first and second electrodes, a mechanically isolated electrically attractable member positioned within the gap, wherein the electrically attractable member is movable within the gap between a first position closer to the first electrode than the second electrode and a second position closer to the second electrode than the first electrode, a fourth electrode coplanar with the first electrode; and a fifth electrode coplanar with the second electrode, wherein the first and second electrodes are positioned to overlap with a substantial portion of a first portion of the electrically attractable member and the fourth and fifth electrodes are positioned to overlap with a substantial portion of a second portion of the electrically attractable member; the method comprising applying a first voltage between the first electrode and the third electrode such a force is applied between the first half of the third electrode and the first electrode and applying a second voltage between the fifth electrode and the third electrode such that a force is applied between the second half of the third electrode and the fifth electrode.

Another embodiment disclosed herein includes a method of manufacturing an electromechanical device including depositing a first electrode layer, depositing a first sacrificial layer over the first electrode layer, depositing a second electrode layer over the first sacrificial layer, etching the second electrode layer to create substantially isolated regions of the second electrode layer, depositing a second sacrificial layer over the second electrode layer such that the isolated regions of the second electrode layer are substantially surrounded by sacrificial material, depositing a third electrode layer over the second sacrificial layer, and removing the sacrificial layers so that the isolated regions of the second electrode layer are positioned within gaps between the first and third electrode layers, the gaps formed by removing the sacrificial layers.

DETAILED DESCRIPTION

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
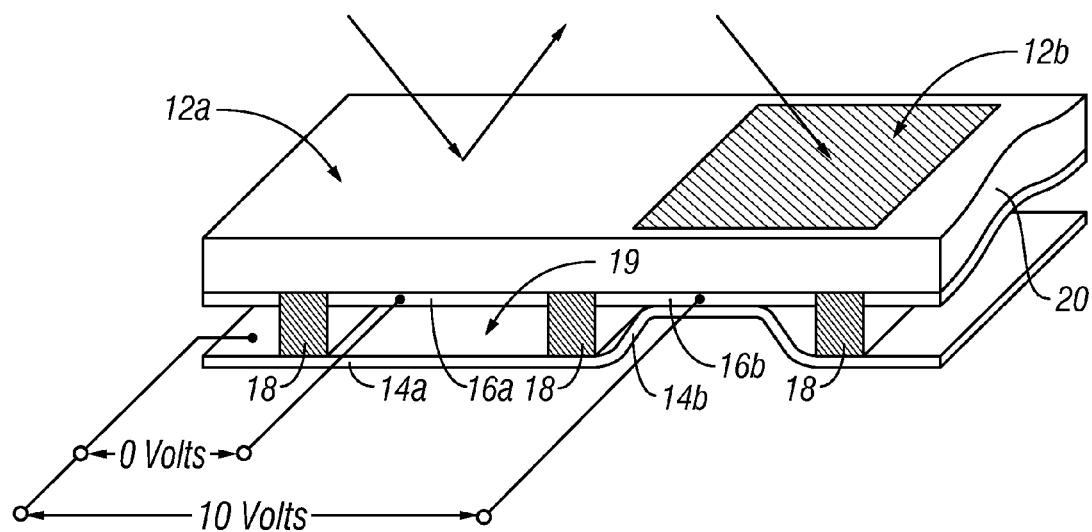
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators according to FIG. 1 in a display application.

Figure 2:
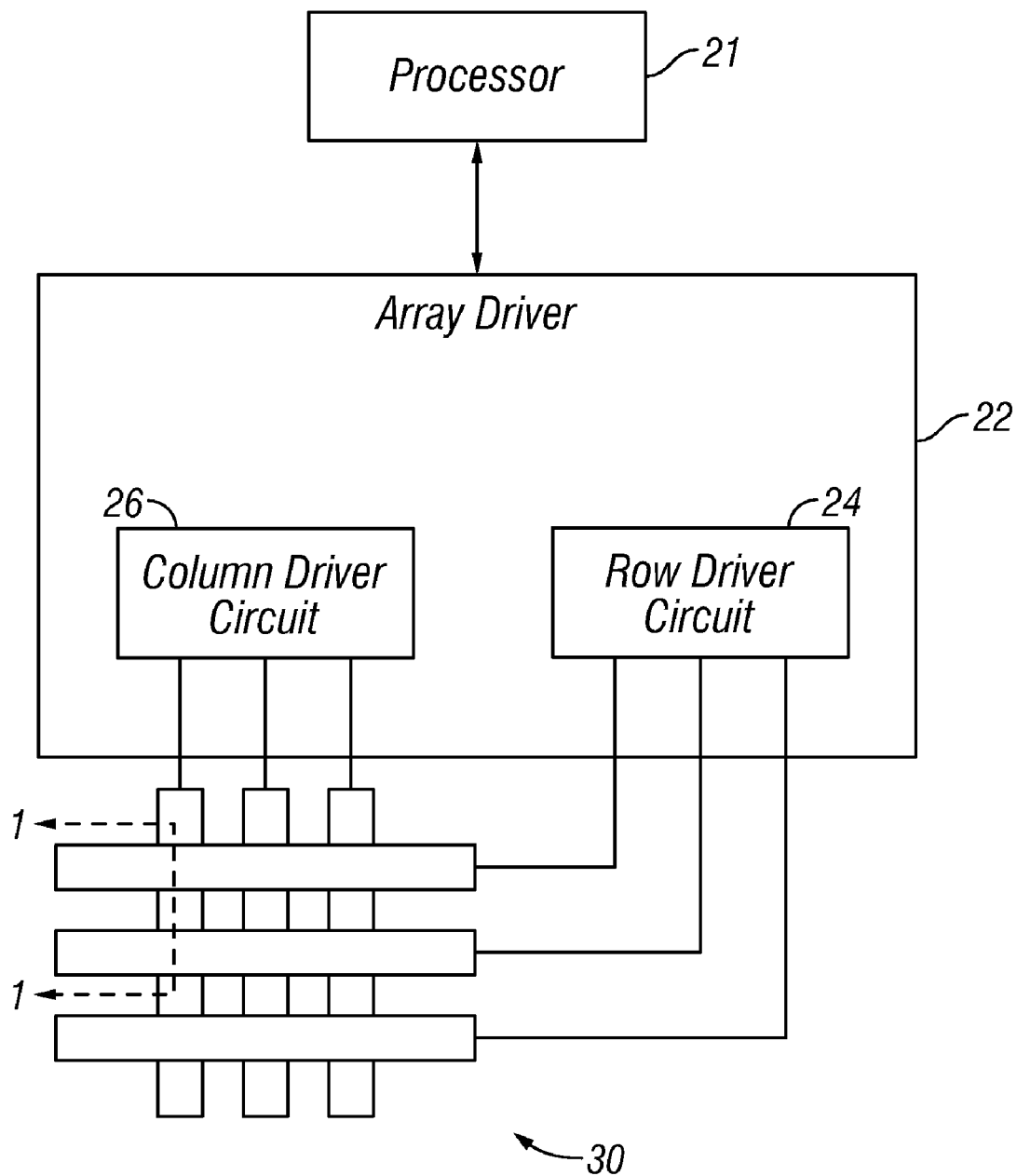
FIG. 2 is a system block diagram illustrating one embodiment of an electronic device incorporating a 3×3 interferometric modulator display.

FIG. 2 is a system block diagram illustrating one embodiment of an electronic device that may incorporate aspects of an interferometric modulator display. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
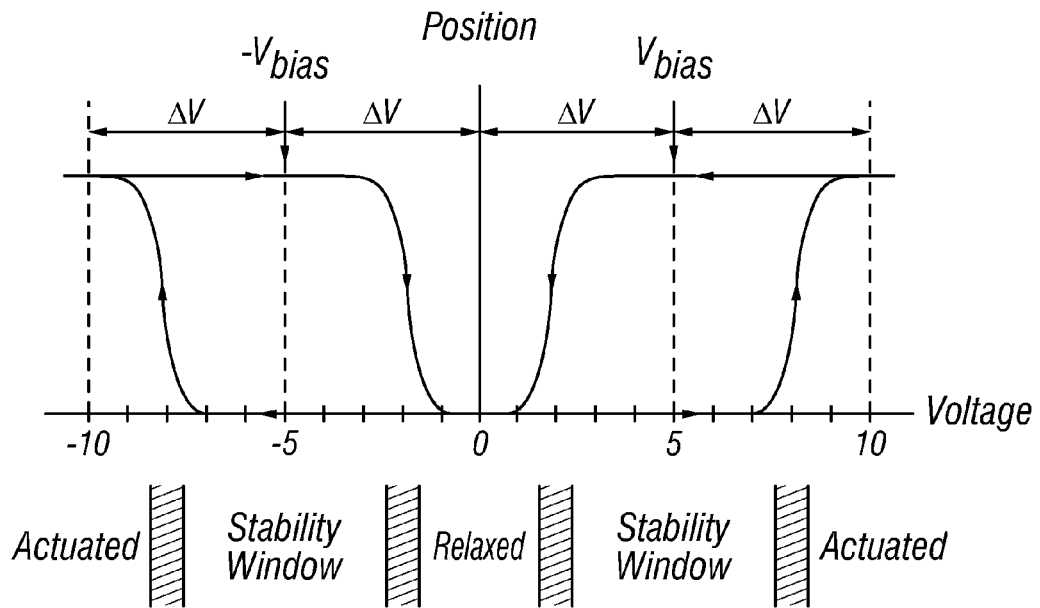
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
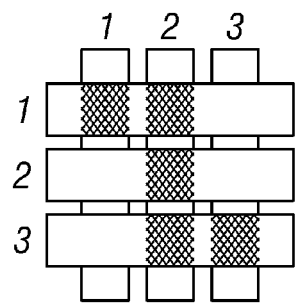
FIGS. 5A and 5B illustrate one exemplary timing diagram for row and column signals that may be used to write a frame of display data to the 3×3 interferometric modulator display of FIG. 2.
Figure 5B:
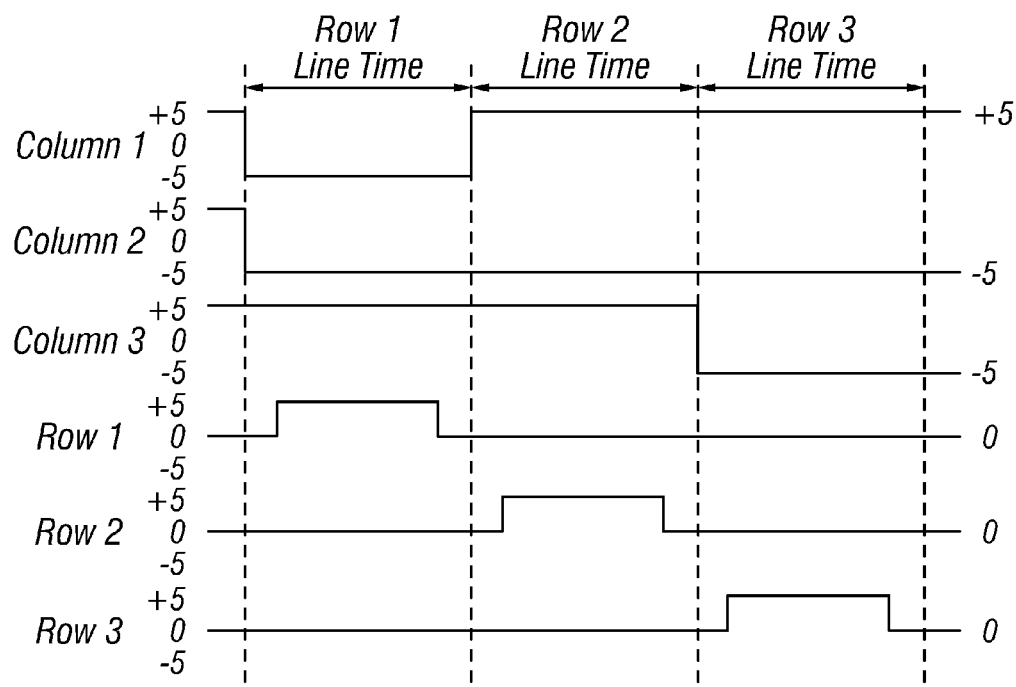

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
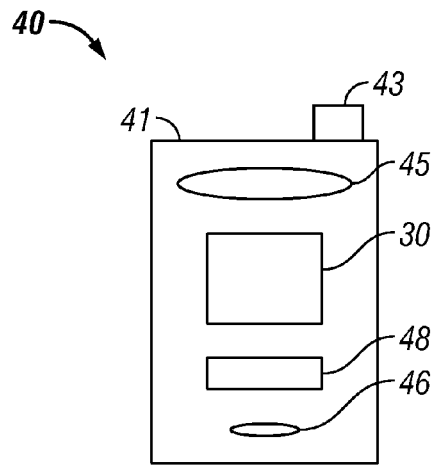
FIGS. 6A and 6B are system block diagrams illustrating an embodiment of a visual display device comprising a plurality of interferometric modulators.
Figure 6B:
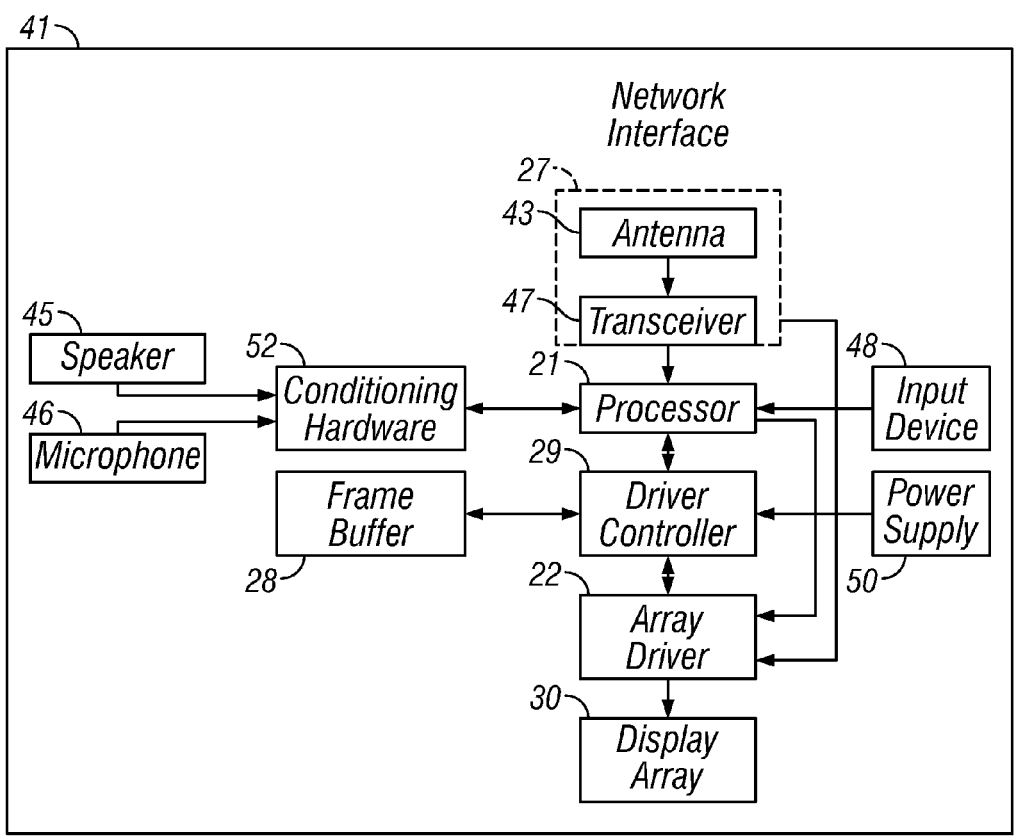

FIGS. 6A and 6B are system block diagrams illustrating an embodiment of a display device 40 that may incorporate interferometric modulator elements according to any of the structures described herein. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
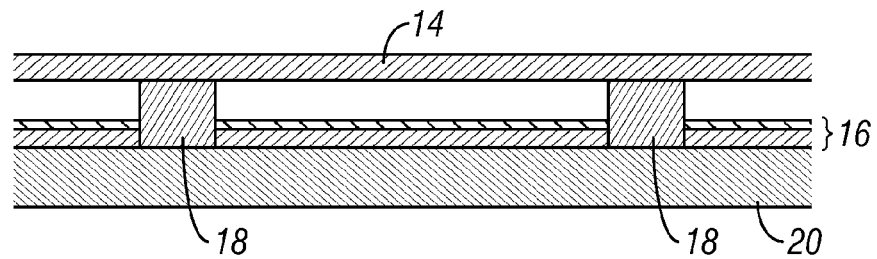
FIG. 7A is a cross section of the device of FIG. 1.
Figure 7B:
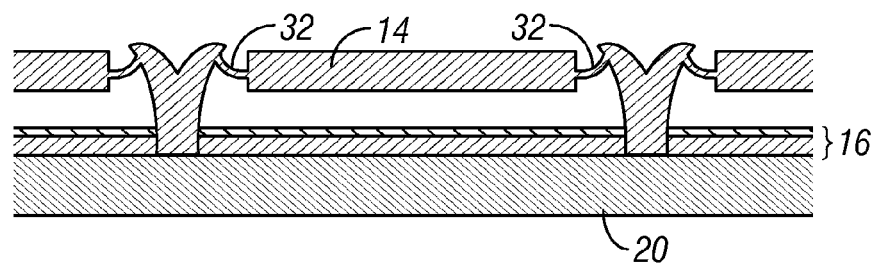
FIG. 7B is a cross section of an alternative embodiment of an interferometric modulator.
Figure 7C:
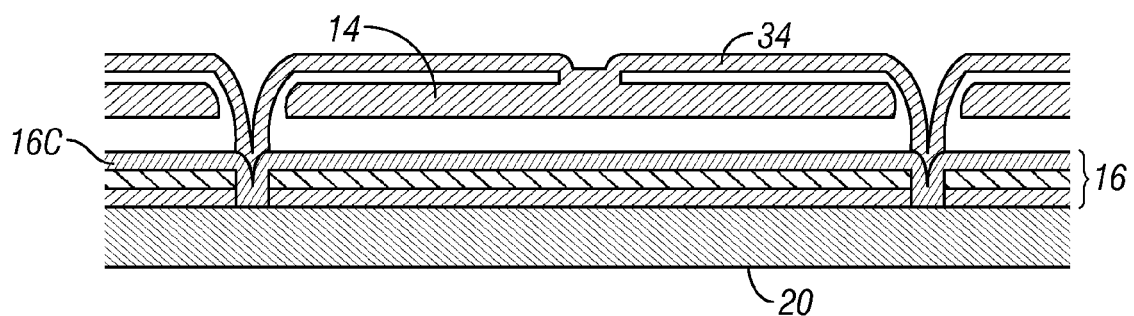
FIG. 7C is a cross section of another alternative embodiment of an interferometric modulator.
Figure 7D:
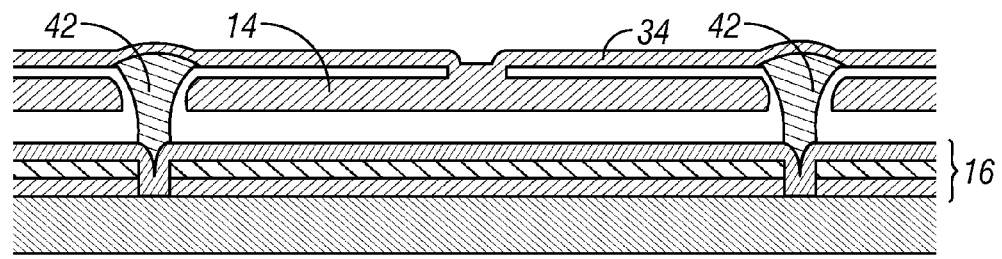
FIG. 7D is a cross section of yet another alternative embodiment of an interferometric modulator.
Figure 7E:
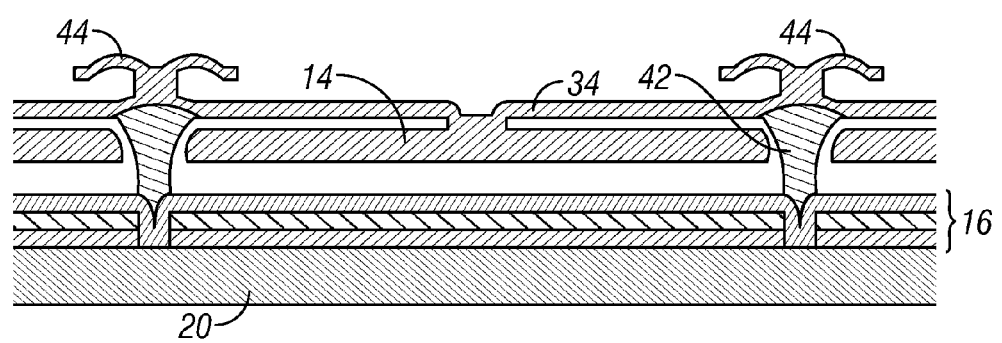
FIG. 7E is a cross section of an additional alternative embodiment of an interferometric modulator.

FIGS. 7A-7E illustrate five different embodiments of interferometric modulators operating essentially under the same principles as the one described in connection with FIGS. 1-5B. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

In the interferometric modulators described above, a movable mirror is coupled to a mechanical membrane such that mechanical restoring forces are built in to the device. The mechanical membrane is deflected from its stationary or quiescent position by an applied voltage and resulting electrostatic attraction. In the absence of the applied voltage, the mechanical restoring forces cause the membrane to revert to a position that is a pre-selected distance from the stationary reflective layer. However, it has been found that such restoring forces are bulk forces, which do not scale favorably with the shrinking of device size. This restricts the size of the mirror that can be used in these types of interferometric modulators. The restriction on mirror size can result in a lower fill factor (i.e., the ratio of active pixel area to non-active pixel area) and lower contrast ratio. In addition, the materials used for the mechanical membrane may be different from those used for the mirror, which can cause undesirable tilt and/or curvature in the mirror. For example, a mismatch in coefficient of thermal expansion between the mirror and the mechanical membrane can affect thermal stability of the device, causing mirror curvature. Further, stress relaxation in the mechanical membrane due to aging and other effects can degrade the restoring forces and create image retention issues in the interferometric modulator.

Figure 8:
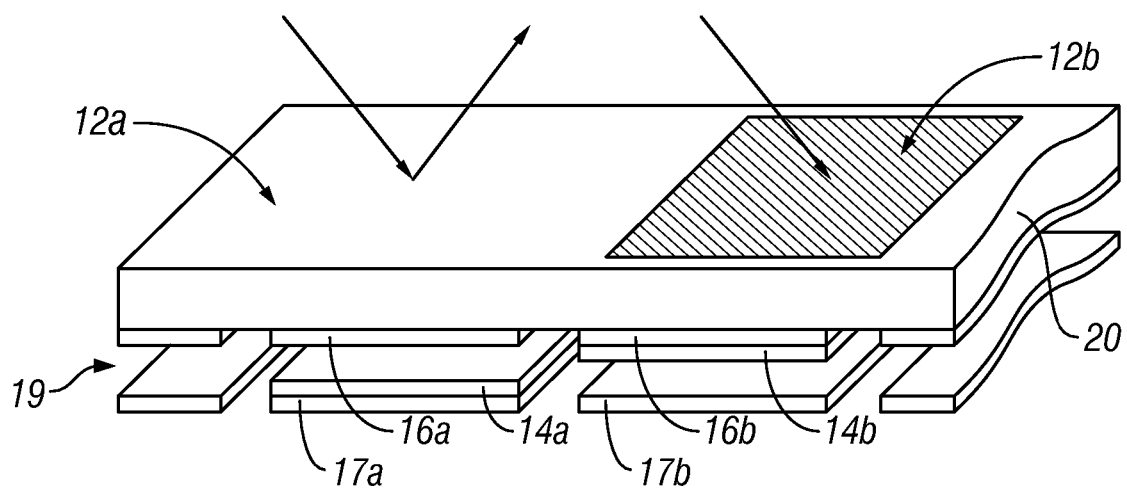
FIG. 8 is a perspective view of an embodiment of two interferometric modulators utilizing a mechanically isolated movable reflective layer.

Accordingly, in some embodiments described herein, interferometric modulators are provided that comprise a mirror that is mechanically isolated from the rest of the interferometric modulator structure. One such embodiment comprising an interferometric MEMS display element is illustrated in FIG. 8. Similar to the embodiments of interferometric modulator depicted in FIGS. 7A-7E, the pixels may be in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can also be configured to reflect predominantly at selected colors, allowing for a color display in addition to black and white. MEMS pixels can further be configured to provide analog operation in which the light reflectance properties may change between dark, color of varying wavelength, and bright states.

FIG. 8 is an isometric view depicting an embodiment of two adjacent pixels in a series of pixels of a visual display (only two of the pixels are shown for the sake of clarity), wherein each pixel comprises a MEMS interferometric modulator having a mirror 14 that is mechanically isolated (floating) from the rest of the interferometric modulator structure. Mirror 14 is analogous to the reflective layer 14 illustrated in FIGS. 7A-7D. In some embodiments, an interferometric modulator display comprises an array of these interferometric modulators arranged in rows and columns. Each interferometric modulator includes a pair of reflective layers positioned at a controlled variable distance from each other to form a resonant optical cavity with at least one variable dimension. In one embodiment, one of the reflective layers may be moved between two positions. In the first position, referred to herein as the down position, the movable reflective layer is positioned at a relatively large distance from a fixed partially reflective layer. In the second position, referred to herein as the up position, the movable reflective layer is positioned more closely adjacent to the partially reflective layer. Incident light that reflects from the two layers can interfere constructively or destructively depending on the position of the movable reflective layer, producing a selectable reflective or non-reflective state for each pixel.

The depicted portion of the pixel array in FIG. 8 includes two adjacent interferometric modulators 12a and 12b. In the interferometric modulator 12a on the left of the figure, a movable reflective layer 14a is illustrated in the down position at a predetermined distance from an optical stack 16a, which includes a partially reflective layer (not shown for clarity). In this embodiment, the distance of the movable reflective layer 14a from the optical stack 16a is determined by the location of a bottom electrode 17a with respect to the optical stack 16a. For example in some embodiments, the distance between the optical stack 16a and the movable reflective layer 14a may be on the order of hundreds of angstroms. In the interferometric modulator 12b on the right, the movable reflective layer 14b is illustrated in the up position, where the movable reflective layer 14b is adjacent to the optical stack 16b (i.e., the gap or distance between the movable reflective layer 14b and the optical stack 16b is less than 300 angstroms).

In contrast to conventional interferometric modulators, the movable reflective layers 14a and 14b (collectively referred to as movable reflective layers 14) may be mechanically isolated from the optical stacks 16a and 16b and the bottom electrodes 17a and 17b. By "mechanically isolated," it is meant that the movable reflective layers 14 experience no substantial restoring forces in a direction opposing a direction of movement due to contact with other structures in the interferometric modulators (e.g., due to mechanical tethers or springs). The movable reflective layers 14 may be constructed from any suitable reflective material such as various metals (e.g., aluminum, nickel, gold) or a dielectric stack (e.g., dielectric mirror). In one embodiment, the movable reflective layers 14 are aluminum. In some embodiments, the movable reflective layer 14 comprises multiple layers sandwiched together.

The optical stacks 16a and 16b (collectively referred to as optical stack 16), as referenced herein, typically comprise several fused layers, which can include an electrode layer (e.g., a top electrode), such as indium tin oxide (ITO), a partially reflective layer such as chromium, and a transparent dielectric. The optical stack 16 thus comprises an electrically conductive portion, is partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials. The dielectric layer in the optical stack, where present, serves to electrically insulate the movable reflective layers 14 from the conductive portions of the optical stacks 16 as well as define the position of the movable reflective layers 14 when the interferometric modulator is in the up state. In some embodiments, alternatively to or in addition to the dielectric layer in the optical stack 16, a dielectric layer may be deposited on a surface of the movable reflective layer 14 facing the optical stack 16 in order to electrically insulate the movable reflective layer 14 from the electrode in the optical stack 16 when in the up state.

The bottom electrodes 17a and 17b (collectively referred to as bottom electrodes 17) may be constructed of any conductive material such as metal (e.g. aluminum, silver, nickel, gold) or indium tin oxide (ITO). In some embodiments, a dielectric layer (not shown) is included to insulate the bottom electrodes 17 from the movable reflective layers 14 when the interferometric modulator is in the down state. In some embodiments, the bottom electrodes 17 and dielectric layer combination are rigid enough such that they do not deform under the electrical forces applied during pixel driving. In some embodiments, the bottom electrodes 17 are supported by a second substrate (not shown) spaced from the substrate 20 (i.e., the second substrate is located on the bottom of the interferometric modulators depicted in FIG. 1). In some embodiments, alternatively to or in addition to the dielectric layer on the bottom electrode 17, a dielectric layer may be deposited on the surface of the movable reflective layer 14 facing the bottom electrode 17 in order to electrically insulate the movable reflective layer 14 from the bottom electrode 17.

As discussed in more detail below, the movable reflective layers 14 may be moved between the up state and the down state using electrostatic forces provided between the optical stack 16 and the bottom electrodes 17. The electrostatic forces may be induced by applying voltages to the optical stack 16 and bottom electrodes 17. In some embodiments, charge is transferred into or out of the movable reflective layers 14 to create a desired potential difference between the movable reflective layers 14 and the optical stack 16 and/or the bottom electrodes 17. The charge transfer element may be any suitable structure for changing the charge of the movable reflective layers 14 such as an electrical coupling to a driving circuit (e.g. one or more electrical contacts or flexible conductive tethers) or a non-electrical charge transfer structure such as an electrostatic generator (for example, based on tribocharging). In some embodiments, charge is permanently embedded in the movable reflective layer during manufacturing. When a potential difference is generated between an optical stack 16 and a movable reflective layer 14, the movable reflective layer 14 moves towards the optical stack 16 until it is in an up position (e.g. as depicted by the interferometric modulator 12b in FIG. 8). When a potential difference is generated between a bottom electrode 17 and a movable reflective layer 14, the movable reflective layer 14 moves towards the bottom electrode 17 until it is in a down position (e.g. as depicted by the interferometric modulator 12a in FIG. 8). When no voltage is applied to either the optical stack 16 or the bottom electrode 17, the movable reflective layer 14 will remain in its current state (either up or down), held in place by adhesive forces. Thus, a display utilizing interferometric modulators according to FIG. 8 can retain an image without any power supplied to it.

In some embodiments, the movable reflective layer 14 is also magnetized. Magnetic layers may then be included in the bottom electrode 17 and optical stack 16 to provide further holding forces when the movable reflective layer 14 is an up or down state. In addition, magnetic structures may optionally be included at various other locations in the interferometric modulator to magnetically guide the movable reflective layer 14 while it is moving. For example, magnetic structures on the periphery of the interferometric modulator may be used to limit lateral movement of the movable reflective layer 14.

As discussed above, the movable reflective layer 14 can be electrically insulated from the optical stack 16 and the bottom electrode 17 by intervening dielectric layers deposited either on the optical stack 16 and bottom electrode 17 and/or on the movable reflective layer 14 itself. In some embodiments, the movable reflective layer 14 may also be electrically isolated from the optical stack 16 and bottom electrodes 17 through external circuitry, such as a diode, that prevents current flow.

In various embodiments, the potential of the movable reflective layers 14 may be uncontrolled at all times, may be controlled only when in the up or down positions, or may be controlled in an analog fashion at all positions of movement between the fully up state and the fully down state. In one embodiment, the movable reflective layers 14 remain electrically floating at some arbitrary voltage. However, the arbitrary voltage is not necessarily predictable and may change over the lifetime of the display. Alternatively, the potential of the movable reflective layers 14 may be controlled only when in the up or down states by providing charge transfer elements (e.g. electrical contacts) that can supply charge to the movable reflective layers 14 when in these states. In one embodiment, the electrical contacts are always connected to ground (i.e., grounding planes are provided that contact the movable reflective layers 14 when in the up or down state). In one embodiment, the grounding planes are conductive (e.g., metal) layers overlapping a portion of the dielectric layers deposited on the optical stack 16 and bottom electrode 17. When the movable reflective layer 14 is in a down or up state, it will contact both the respective dielectric layer and the grounding plane. Such grounding planes are described in more detail below with respect to FIGS. 17A-17K. In another embodiment, the potential of the movable reflective layers 14 are also controlled during movement by utilizing conductive guides that contact the movable reflective layers 14 or by providing a thin flexible tether electrically coupled to the movable reflective layers 14 at all times. Advantageously, any tether used is flexible enough that it doesn't supply any substantial mechanical force to the movable reflective layers. To achieve substantial flexibility, tethers may be made from materials with low stress and small Young's modulus. For example, a layer of thin Al (e.g., less than about 50 nm) may be used for the tether. Such layers may also be used to form the reflective material in the movable reflective layer. Thus, the same deposition step may be used to form the movable reflective layer and the tethers. In one embodiment, the width of the tether is less than 10 μm. In some embodiments, tethers are attached between the movable reflective layer and a guide post. In one embodiment, the location of attachment to the guide post is approximately in the middle of the guide post in order to equally minimize mechanical influence for both top and bottom positions of the movable reflective layer.

In one embodiment, the top and bottom electrodes (the optical stack 16 and the bottom electrode 17) for each interferometric modulator are divided into two or more sub-electrodes that may be individually driven. Such an arrangement allows tilt to be induced into the movable reflective layer 14. For example, in one embodiment, the top electrode of optical stack 16 is divided into left and right halves and the bottom electrode 17 is divided into left and right halves. If the same non-ground potential is driven on the top left and right sub-electrodes, then the movable reflective layer 14 will be drawn to an up state (e.g. a dark state). On the other hand, if the same non-ground potential is driven on the bottom left and right sub-electrodes, then the movable reflective layer 14 will be drawn to a down state (e.g., a bright state having the color determined by the reflective layer spacing). If however, the same non-ground potentials are driven to the top left and bottom right sub-electrodes while top right and bottom left sub-electrodes are held at ground potential, then the movable reflective layer 14 will tilt with the left half attracted to an up state and the right half attracted to a down state. Such a tilted movable reflective layer 14 may cause the interferometric modulator to reflect a virtual white state due to the spectral width of the reflected light. For example, if the movable reflective layer 14 tilts at an angle, the distance between the movable reflective layer 14 and the optical stack 16 will vary continuously across the interferometric modulator. Because the wavelength of reflected light depends on this distance, a broad spectrum of wavelengths will be reflected from the interferometric modulator, resulting in a spectrum that approximates a white state spectrum. Thus, this type of interferometric modulator can provide three display states, a dark state, a bright color state, and a bright white state.

Although an interferometric modulator for display applications has been described above, it will be appreciated that MEMS devices having a mechanically isolated electrically attractable member may be used in virtually any application where a mechanical membrane might otherwise be used. For example, MEMS structures having two electrodes with an intermediate electrically attractable member may be used in electrical switching applications, optical switching applications, piezoelectric applications, and sensor applications.

To demonstrate certain operating characteristics of an interferometric modulator according to FIG. 8, an electromechanical analysis was conducted to model the electrostatic potentials and forces involved in moving the movable reflective layer 14 from one state to another. For the purposes of this model, the potential of the movable reflective layer 14 was assumed to be zero prior to moving and to be electrically floating during motion. In practice, these characteristics can be achieved by using the grounding planes described above to contact the movable reflective layer 14 when in the up or down states.

To start the motion of the movable reflective layer 14, the potential difference between the movable reflective layer 14 and the electrode to which it is to move must be greater than any forces holding the movable reflective layer 14 in its current state. For example, the forces holding the movable reflective layer 14 and the electrode may include adhesive forces and/or magnetic forces. Empirical tests have shown that for a mirror having an area of 70×20 μm², adhesive forces between an aluminum mirror and a dielectric layer are about 10 μN. Thus, 10 μN was used as the minimum required initial electrostatic force. The electrostatic force may be given by:

$$F_e = \frac{\varepsilon_0 A_e V^2}{2d^2} \quad (1)$$

where $\varepsilon_0$ is the permittivity of free space, $A_e$ is the overlap area between the electrode and the movable reflective layer, d is the distance between the movable reflective layer 14 and the attracting electrode, and V is the potential difference between the movable reflective layer 14 and the electrode. Assuming $A_e$=1400 μm², d=2000 Å, and $F_e$=10 μN, equation (1) indicates that an actuation potential greater than 8.0 V is sufficient to actuate the interferometric modulator by moving the movable reflective layer 14. Assuming that the movable reflective layer 14 is being moved from an up state to a bottom state, then the initial conditions are such that $V_{top}=V_{mirror}=0$ V and $V_{bottom} \geqq 8.0$ V, where $V_{top}$ is the potential of the top electrode (i.e., the optical stack 16), $V_{mirror}$ is the potential of the movable reflective layer 14, and $V_{bottom}$ is the potential of the bottom electrode 17. Since the potential between the bottom electrode 17 and the movable reflective layer 14 is sufficient to overcome adhesive forces, the movable reflective layer 14 releases from its static position against the bottom electrode 17 and becomes electrically isolated (i.e., its charge will remain constant). The charge on the movable reflective layer 14 may be given by:

$$Q = C_{mirror-bottom} V_0 = \frac{\varepsilon_0 A_e}{d} V_0 \qquad (2)$$

where $C_{mirror-bottom}$ is the capacitance between the movable reflective layer 14 and the bottom electrode 17 and $V_0$ is the initial potential difference between the movable reflective layer 14 and the bottom electrode 17. Given initial values of $A_e$=1400 µm², d=2000 Å, and $V_0$=8.0V, the charge Q on the movable reflective layer 14, which remains constant throughout actuation, is 9.3×10$^{-13}$ C.

During the movement of the movable reflective layer 14 from an up position to a down position, the distance between the movable reflective layer 14 and the bottom electrode 17 decreases, causing the voltage between the movable reflective layer 14 and bottom electrode 17 to decrease and the capacitance to increase. The voltage as a function of movable reflective layer 14 displacement x is given by:

$$V_{mirror-bottom} = Q \frac{(d-x)}{\varepsilon_0 A_e} \qquad (3)$$

The electrostatic force supplied to the movable reflective layer 14 by the bottom electrode 17 as a function of displacement is given by:

$$F_{bottom} = Q \frac{V_{mirror-bottom}}{2(d-x)} = \frac{Q^2}{2\varepsilon_0 A_e} = 10 \, \mu N \qquad (4)$$

Thus, the force applied by the bottom electrode 17 is constant throughout the motion of the movable reflective layer 14. The electrostatic force applied by the top electrode is not constant and acts against the force applied by the bottom electrode 17. Nonetheless, it can be shown that the upward force exerted by the top electrode never exceeds the downward force exerted by the bottom electrode 17.

Figure 9:
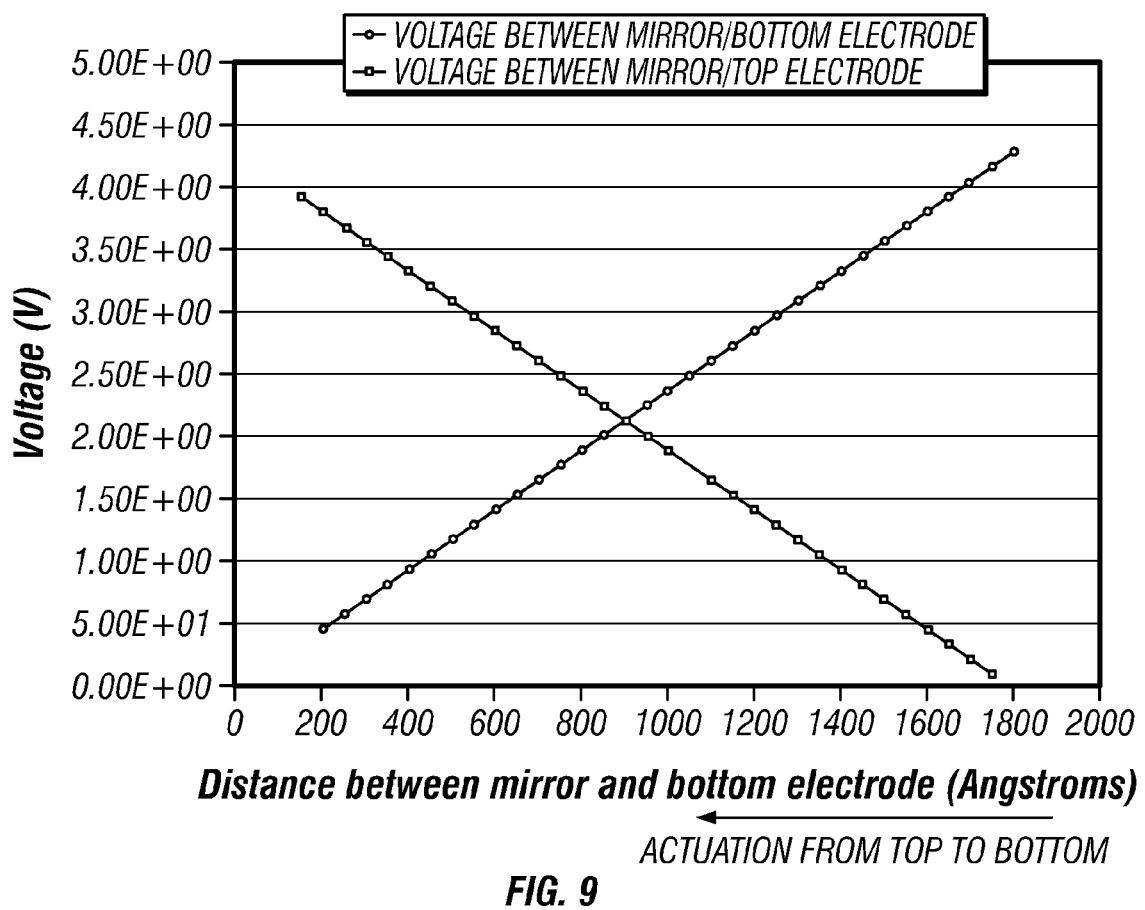
FIG. 9 is a graph depicting a computation of the potential differences between top and bottom electrodes and a movable reflective layer as a function of the reflective layer position, in one embodiment.

FIG. 9 is a graph depicting, in one embodiment, the voltage between the movable reflective layer 14 and the top and bottom electrodes, respectively, during actuation. The x-axis of the graph is the distance between the movable reflective layer 14 and the bottom electrode 17. Thus, for actuation from a top state to a bottom state, the voltages change from right to left. The graph demonstrates that the voltage between the movable reflective layer 14 and the bottom electrode 17 increases linearly while the voltage between the movable reflective layer 14 and the top electrode decreases linearly.

Figure 10:
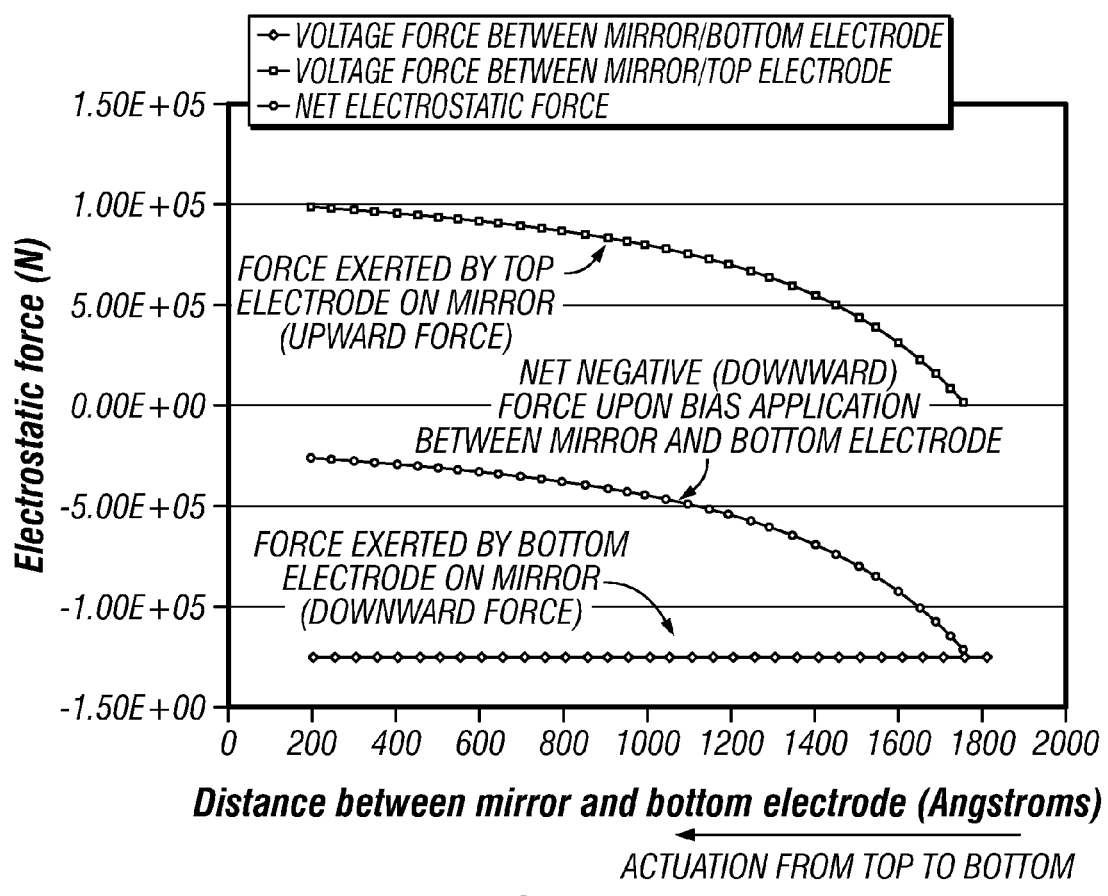
FIG. 10 is a graph depicting a computation of the forces applied to the movable reflective layer by top and bottom electrodes as a function of the reflective layer position, in one embodiment.

FIG. 10 is a graph depicting, in one embodiment, the independent forces exerted on the movable reflective layer 14 by the top electrode and the bottom electrode, as well as the net force exerted on the movable reflective layer 14 by the two electrodes. The sign convention is such that positive forces are in the upward direction. It can be seen that the net force remains negative throughout the motion of the movable reflective layer 14 from top to bottom (i.e., from right to left in the graph).

Figure 11:
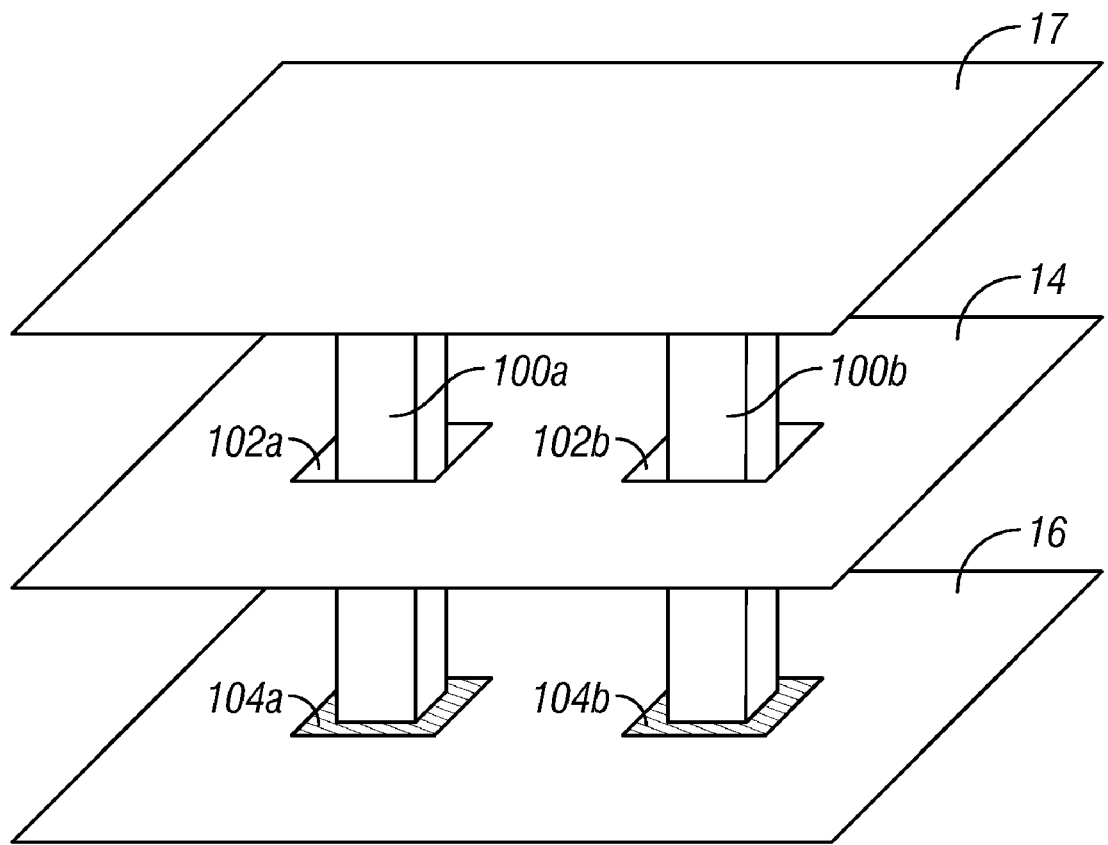
FIG. 11 is a perspective view of an embodiment of an interferometric modulator utilizing a mechanically isolated movable reflective layer that is guided by two guide posts.

In some embodiments, the interferometric modulators described above include guides to constrain lateral movement of the movable reflective layer 14. One such embodiment is depicted in FIG. 11, which is a perspective view of one interferometric modulator according to FIG. 8 comprising a top electrode 16, a bottom electrode 17, and a movable reflective layer 14. In the view of FIG. 11, the interferometric modulator is viewed upside down relative to the view presented in FIG. 8 in order to illustrate black masks 104a and 104b described below. Two posts 100a and 100b (referred to collectively as posts 100) extend between the top 16 and bottom 17 electrodes. The posts 100a and 100b extend through two apertures 102a and 102b (referred to collectively as apertures 102) formed in the movable reflective layer 14. The apertures 102a and 102b are larger than the width of the posts 100a and 100b so that the movable reflective layer 14 can slide freely up and down over the posts 100a and 100b. In some embodiments, the posts 100 prevent significant lateral or rotational motion of the movable reflective layer 14 while it is being actuated. In some embodiments, the posts 100 can structurally support the bottom electrode 17 (e.g., where the bottom electrode 17 depends upon the substrate 20 for structural support rather than being formed on another "bottom" substrate). In some embodiments, the posts 100 or portions thereof are formed of conductive material such that when the movable reflective layer 14 contacts the posts 100, the potential of the movable reflective layer 14 can be controlled through an electrical connection between the posts 100 and a driving circuit. It will be appreciated that other guide designs may be used. For example, guides positioned along the edges of each interferometric modulator, which may take the form of posts or walls, may also constrain the lateral and/or rotational motion of the movable reflective layer 14. In addition, any number of posts and post locations may be considered. In some embodiments, guides include magnetic structures to constrain lateral movement through the use of magnetic forces.

As discussed above with respect to FIG. 8, the top electrode 16 (i.e., the optical stack) is formed over a transparent substrate. Thus, in a display application, the posts 100 would be visible to a user, thereby decreasing the fill factor and contrast ratio of the display. Accordingly, in some embodiments, black masks 104a and 104b (referred to collectively as black masks 104) are formed between the posts 100a and 100b and the substrate 20 to reduce their visual impact. In other embodiments, the black masks 104a and 104b are formed on the surface of substrate 20 opposite the posts 100a and 100b. In some embodiments, the black masks 104 are made large enough to hide the posts 100, the apertures 102 in the movable reflective layer 14, and grounding planes at the base of the posts used to electrically contact the movable reflective layer 14. Thus, for example, in one embodiment, the posts 100 are 6 µm×6 µm, the apertures 102 are 10 µm×10 µm, and the black masks 104 are 20 µm×20 µm.

Figure 12:
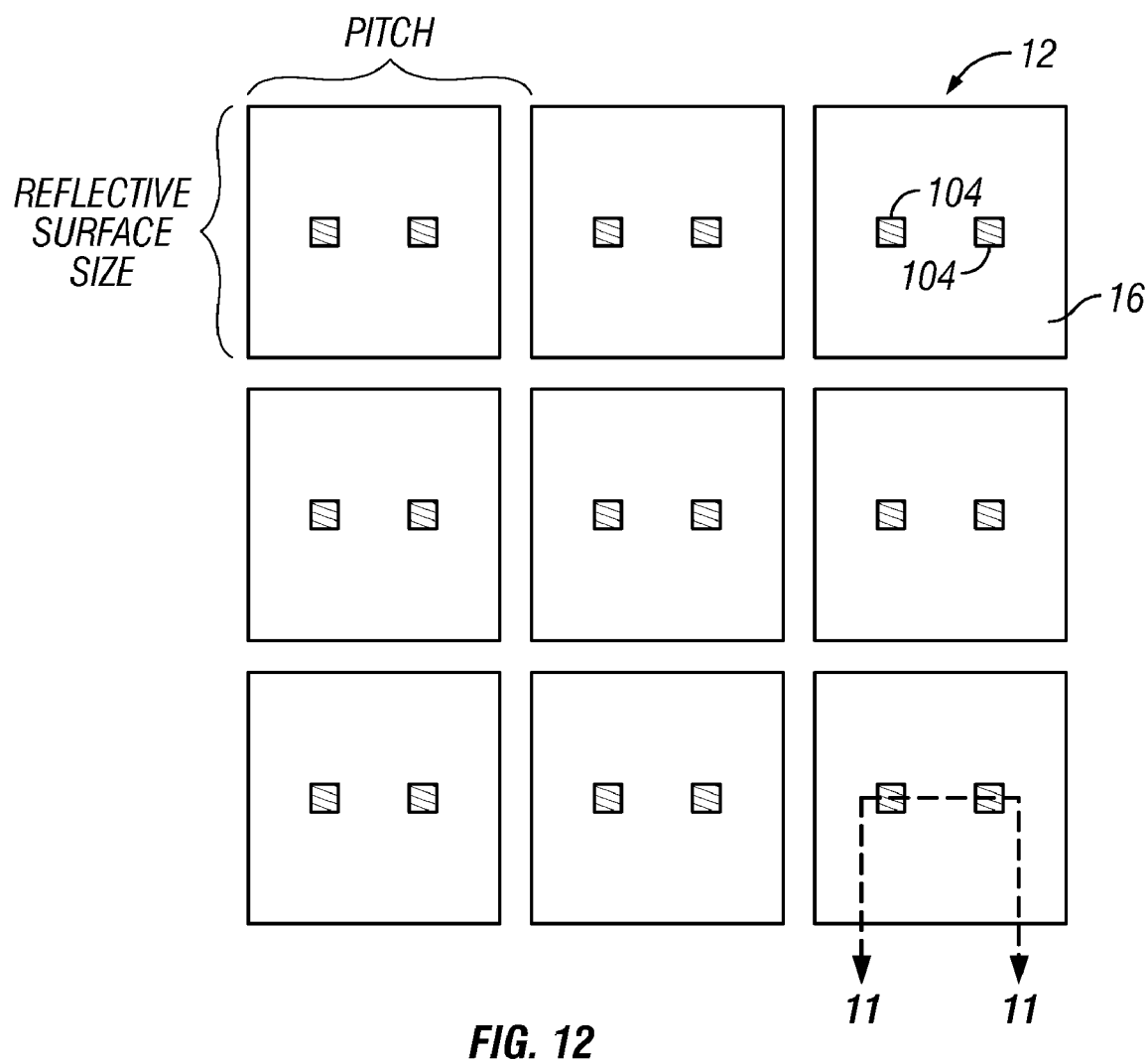
FIG. 12 is a top planar view an embodiment of an array of interferometric modulators using mechanically isolated movable reflective elements guided by guide posts.

FIG. 12 is a top-down view of an array of interferometric modulators 12 depicting the black masks 104 on the substrate and the footprint of the optical stack 16 in one embodiment. The array may be characterized by interferometric modulator pitch (i.e., the distance from the start of one interferometric modulator to the start of an adjacent interferometric modulator) and the dimensions of the reflective surfaces (e.g. optical stack and movable reflective layer). The difference in interferometric modulator pitch and reflective surface size is due to: 1) the built in space between adjacent reflective surfaces to reduce the possibility of mechanical or electrical effects caused by adjacent interferometric modulators and 2) photo and etch biases. Based on this information, fill factors can be determined for various display layouts. For example, for a 115 dpi (dots per inch) monochrome display where each interferometric modulator represents one pixel, pixel pitch would be 222 µm. Factoring for photo and etch bias (e.g. 1 µm on each edge) and functional spacing (e.g. 4 µm), this pitch could be achieved using 216 µm×216 µm optical stack/movable reflective layer structures. Assuming black mask areas of 20 µm×20 µm and considering the non-display area in between pixels, a fill factor of 94% can be achieved. An advantage of some embodiments of the interferometric modulator with mechanically isolated movable reflective layer 14 is that fill factors may be increased in comparison to conventional interferometric modulators utilizing mechanical supports for the movable mirror. Conventional designs have fill factors that are typically between 65%-75%.

Figure 13:
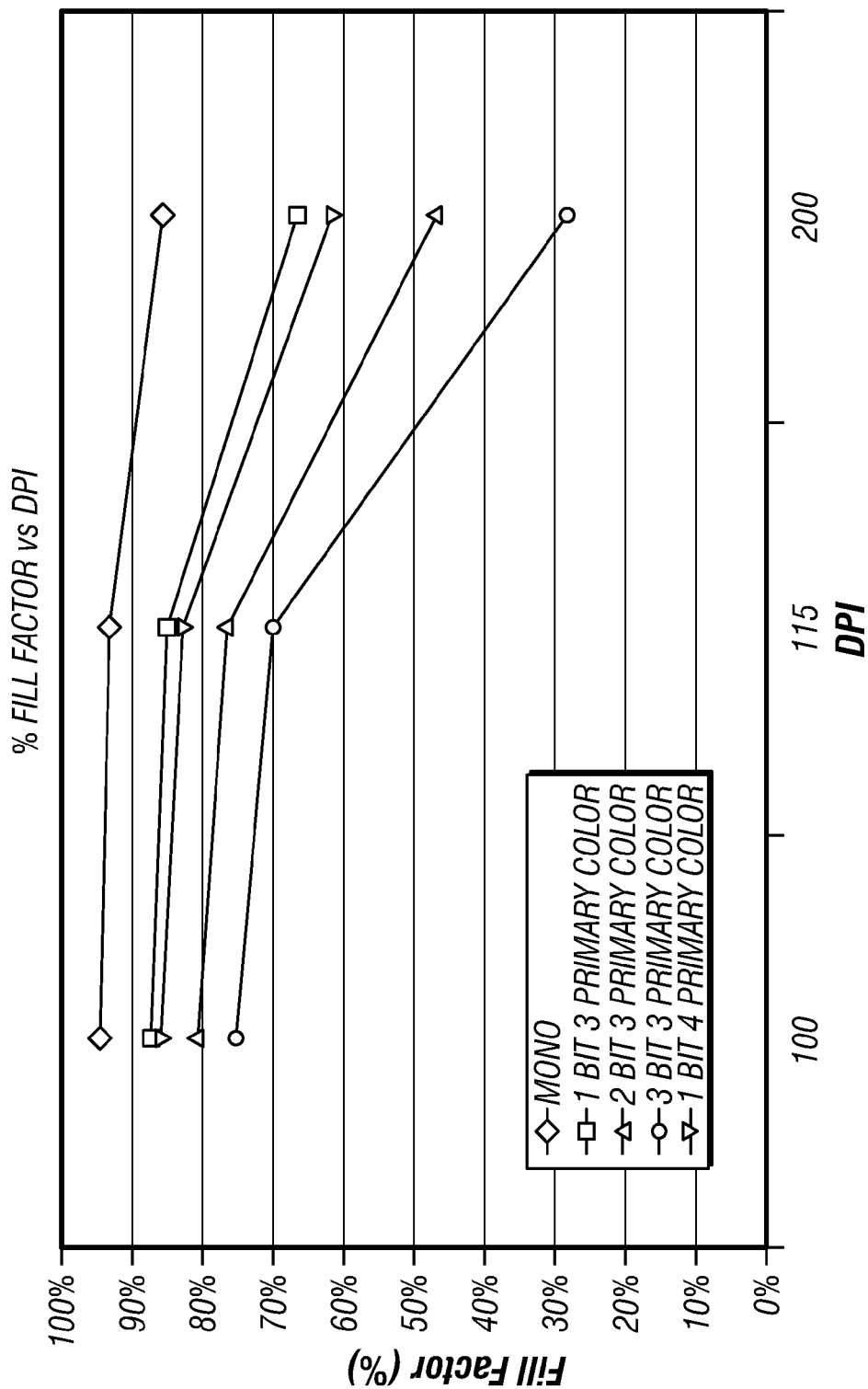
FIG. 13 is a graph depicting a computation of fill factors for various interferometric modulator displays utilizing a mechanically isolated movable reflective layer and guide posts, at differing dot-per-inch and bit-per-color values, in one embodiment.

Fill factors for various interferometric modulator pitches and display types are depicted in the graph in FIG. 13. The various color displays may be constructed by having each pixel comprise several interferometric modulators (i.e., sub-pixels). Different color sub-pixels may be constructed by varying the maximum distance accessible between the movable reflective layer and the optical stack. In some embodiments, color depth may be increased by having multiple sub-pixels of the same color in each pixel. FIG. 13 depicts fill factors for a monochrome design, RGB primary color designs having 1 bit per color (3 sub-pixels), 2 bit per color (6 sub-pixels), or 3 bit per color (9 sub-pixels), and a 4 primary color design. The fill factor for each case was calculated using conservative design rules for mirror spacing and black mask regions to hide the post structure. In this model, the black mask regions occupy two 20 µm×20 µm squares near the center of each sub-pixel. The space between the mirrors are defined by a 4 um photolithography space and a 1 µm CD loss per side.

In some embodiments, a display including an array of interferometric modulators as described above is driven using an active-matrix driving scheme. For example, in some embodiments, each interferometric modulator is connected to a switch circuit for determining upon an update scan whether the interferometric modulator should be actuated and if so, whether the actuation should be to the up state or down state. In some embodiments, the switch circuit for each interferometric modulator is formed in the proximity of the interferometric modulator at the same time as the interferometric modulator is manufactured, for example in similar fashion to that described in co-pending and commonly-assigned U.S. application Ser. No. 11/331,705, filed Jan. 13, 2006. For example, an array of switch circuits may be formed on the substrate adjacent to each interferometric modulator. The active switch elements of the array can be formed below, above or in the same layers as the interferometric modulator. Electrical connections between the switch elements and the interferometric modulator can be achieved by properly patterning conductive layers in the interferometric modulator. In some embodiments, the switch circuit comprises one or more thin film transistors (TFTs). These TFTs may be constructed using techniques known to those of skill in the art.

Figure 14:
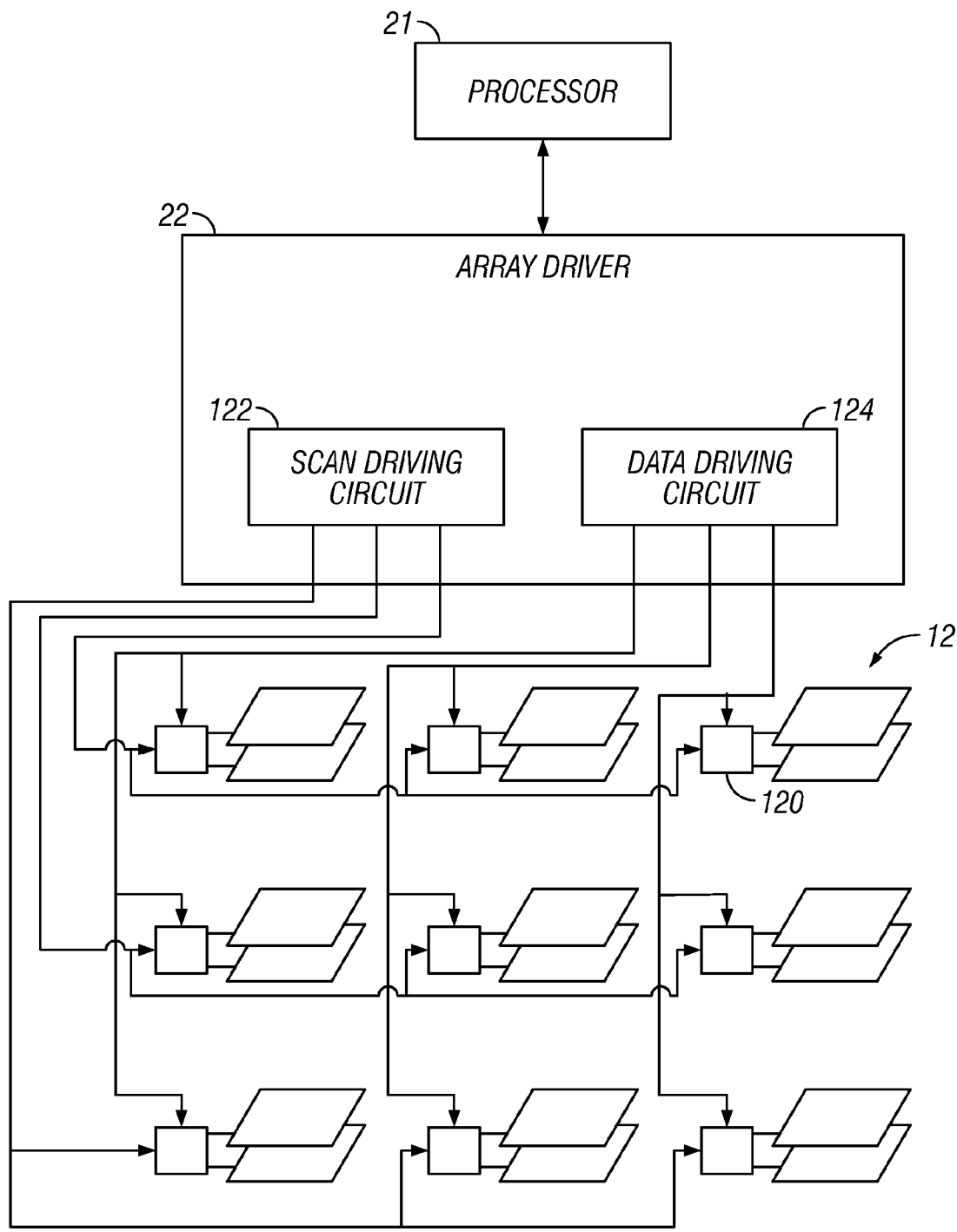
FIG. 14 is system block diagram of an interferometric modulator display utilizing an active-matrix driving scheme, in one embodiment.

FIG. 14 is a schematic depicting one embodiment of an array of interferometric modulators 12 (each depicted isometrically as two parallel plates) and corresponding switch circuits 120 (not all interferometric modulators 12 and switch circuits 120 labeled, for clarity) coupled to an array driver 22 that is controlled by a processor 21. In one embodiment, each row of switch circuits 120 are connected to a single output from a scan driving circuit 122 that is part of the array driver 22. In one embodiment, each column of the switch circuits 120 are connected to a single output from a data driving circuit 124 that is also part of the array driver 22. Thus, the display including the array of interferometric modulators 12 requires only N×M leads for driving, where N is the number rows and M is the number of columns. In addition, each switch circuit 120 may have a connection to a common driving voltage $V_{dd}$. Each interferometric modulator 12 may also have a connection to a ground terminal for the purposes of grounding the movable reflective layer 14 in each interferometric modulator 12. The image on the array may be updated row-by-row by sending a voltage pulse to the respective rows from the scan driving circuit 122. Whether a pixel in the scanned row is actuated and whether actuation is to an up state or a down state is determined by voltages applied to each data driving circuit 124 output. For example, when no voltage is applied to the data driving lead for a particular pixel, the pixel does not change state. When a voltage is applied, its magnitude or polarity may be used to determine whether actuation is to an up state or a down state.

In one embodiment, the array driver 22 communicates with a processor 21, which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

Figure 15:
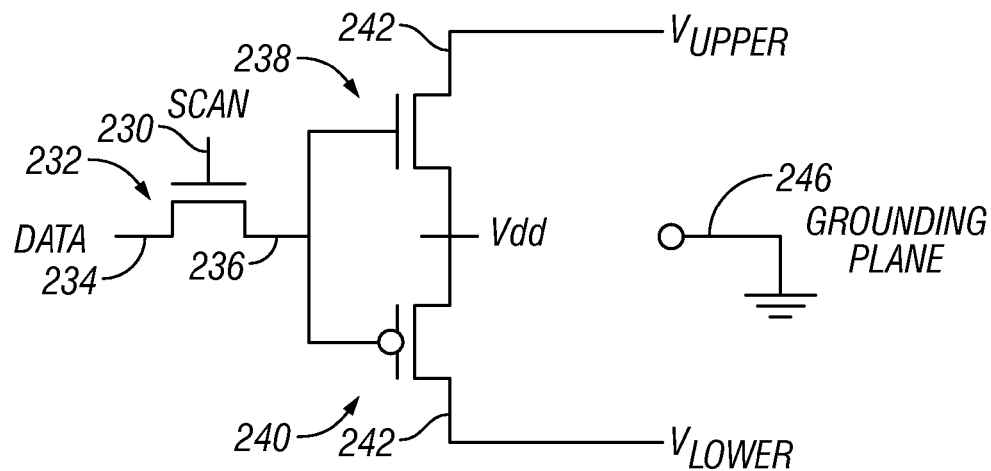
FIG. 15 is a circuit diagram of a switching circuit for use in driving an interferometric modulator utilizing a mechanically isolated movable reflective layer, in one embodiment.

One embodiment of a switch circuit 120 as described above is illustrated in the circuit diagram in FIG. 15. The scan lead 230 from the scan driving circuit 122 is connected to the gate terminal of a pass transistor 232. The data lead 234 from the data driving circuit 124 is connected to the source terminal of the pass transistor 232. The drain lead 236 of the pass transistor 232 is connected to the gates of two additional transistors, a top electrode transistor 238 and a bottom electrode transistor 240 that are respectively coupled to the interferometric modulator top electrode (of optical stack 16) and bottom electrode 17. One of these transistors, such as the bottom electrode transistor 240, has reversed polarity such that only negative potentials applied to the gate permit current flow. The source terminals of the top and bottom electrode transistors 238 and 240 are connected to driving voltage source $V_{dd}$. The drain lead 242 of the top electrode transistor 238 connects to the top electrode (i.e., the optical stack 16). The drain lead 244 of the bottom electrode transistor 240 connects to the bottom electrode 17. When a pulse is sent from the scan driving circuit 122 to the pass transistor 232 (e.g. when a particular row in the array is scanned), the voltage being applied to the data lead 234 by the data driving circuit 124 is permitted to pass to the gates of the top and bottom electrode transistors 238 and 240. If the data voltage has positive polarity, the driving voltage $V_{dd}$ is applied to the top electrode of optical stack 16, causing the movable reflective layer 14 of the interferometric modulator to actuate to an up state. If the data voltage has negative polarity, the driving voltage $V_{dd}$ is applied to the bottom electrode 17, causing the movable reflective layer 14 of the interferometric modulator to actuate to a down state. Those of skill in the art will appreciate many alternative switch circuit architectures that may be used to select an interferometric modulator for actuation and select the actuation state.

In addition to connection to the top electrode and bottom electrode terminals of the switching circuit, each interferometric modulator may be connected to a ground terminal 246 for grounding the movable reflective layer. As discussed above, the movable reflective layer 14 may be grounded at various times and by various means, including but not limited to, grounding plane contacts that contact the layer when it is in an up or down state, conductive guides (e.g. posts) that may contact the movable reflective layer 14 periodically during its actuation, and a conductive tether. Thus, in some embodiments, interferometric modulators according to those described above may be considered as a three-terminal device with separate addressable electrodes for the top, bottom and movable reflective layers.

Figure 16:
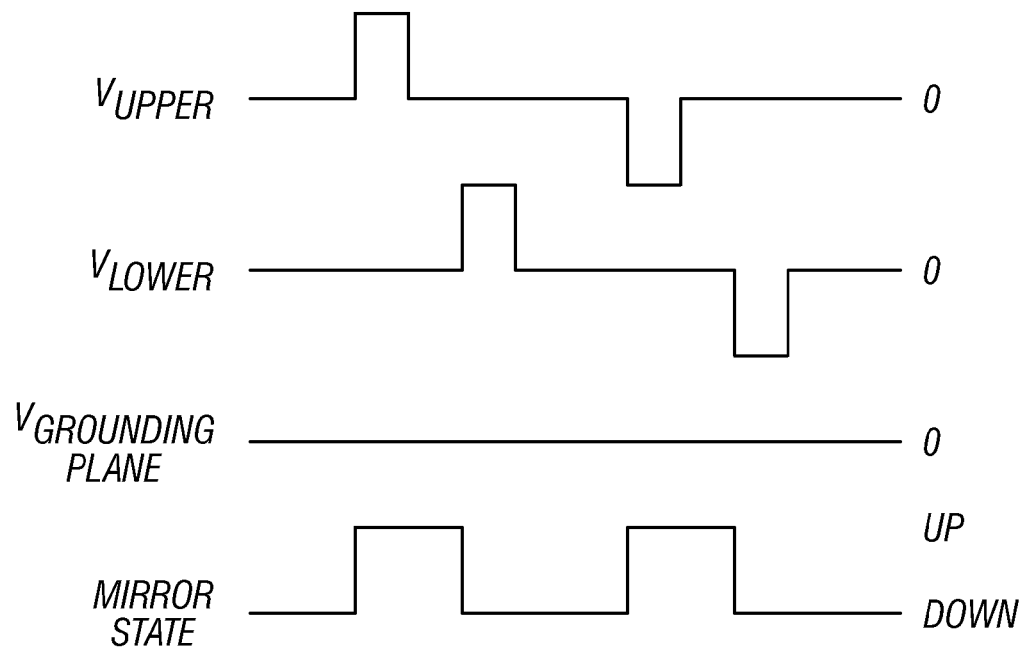
FIG. 16 is a timing diagram of a driving scheme for driving an interferometric modulator utilizing a mechanically isolated movable reflective layer, in one embodiment.

FIG. 16 depicts a timing diagram for a three-terminal interferometric modulator in one embodiment. The grounding plane voltage remains 0 V at all times. When the switching circuit 120 is driven to actuate the interferometric modulator to an up state, a voltage pulse is applied to the top electrode of the optical stack 16 of the interferometric modulator. As shown in FIG. 16, this first pulse causes the movable reflective layer 14 of the interferometric modulator to move to an up state. A subsequent pulse driven by the switching circuit 120 to the bottom electrode 17 causes the movable reflective layer 14 to move to a down state. As the timing diagram depicts, the pulses driven to the top and bottom electrode terminals may also have reversed polarity and still result in the movable reflective layer 14 being actuated to an up or bottom state. Accordingly, in some embodiments, the polarity of the driving voltage pulses is alternated for each sequential pulse (e.g., as shown in FIG. 16). This alternation of driving pulse polarity can be used to maintain an average neutral charge in the interferometric modulators. The polarity of the driving pulses may be alternated by periodically reversing the polarity of the driving voltage $V_{dd}$ supplied to each switching circuit.

With reference to FIG. 8, in some embodiments, the layers of the optical stack 16 are patterned into individual rectangular electrodes (e.g. optical stacks 16a and 16b), one for each interferometric modulator. Similarly, the bottom electrodes 17 may be formed by patterning a bottom electrode layer into individual rectangular electrodes (e.g. bottom electrodes 17a and 17b), one for each interferometric modulator. The bottom electrodes 17 may be supported by a series of posts by depositing the bottom electrode layer onto the top of the posts and an intervening sacrificial material deposited between the posts and over the movable reflective layers 14. When the sacrificial material is etched away, the bottom electrodes 17 are separated from the optical stack 16 by a gap 19 within which the movable reflective layers 14 are positioned. In some embodiments, the bottom electrodes 17 are further supported by a second substrate deposited on top of the bottom electrodes 17. The second substrate may be adhered to the first substrate 20 using an adhesive along the edges of the display.

The interferometric modulators may be constructed using photolithographic techniques known to those of skill in the art. For example, in some embodiments, the interferometric modulators are manufactured through a series of deposition and etching steps. Each deposited layer of the material may be patterned by depositing a layer of photosensitive material such as photoresist which is then exposed to light in the desired pattern. The non-light exposed areas are removed using a suitable etchant followed by etching the now physically exposed layer below. Finally, the remaining photoresist is completely removed by a suitable etchant prior to deposition and patterning of further layers of material.

Figure 17A:
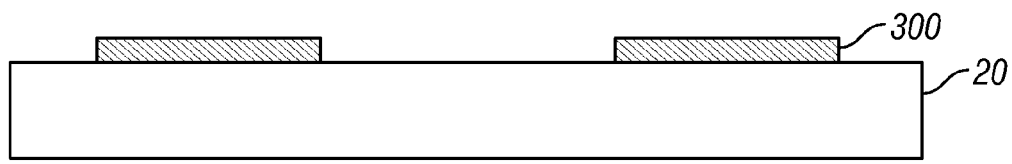
FIGS. 17A-17K are cross-sectional views depicting an embodiment of the manufacturing of an interferometric modulator utilizing a mechanically isolated movable reflective layer and guide posts.
Figure 17B:
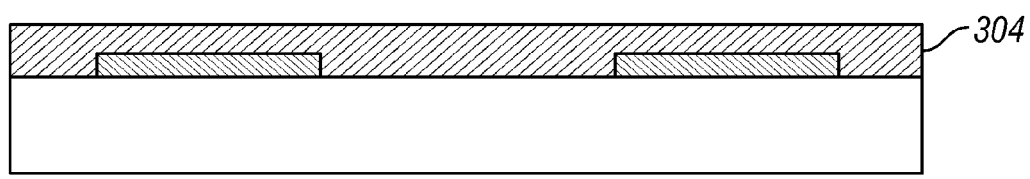
Figure 17C:
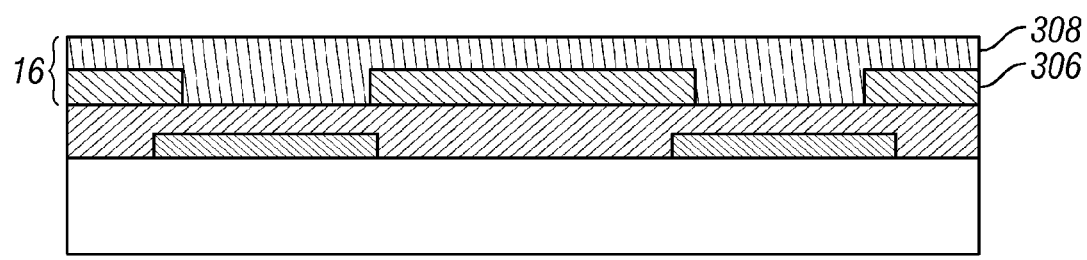
Figure 17D:
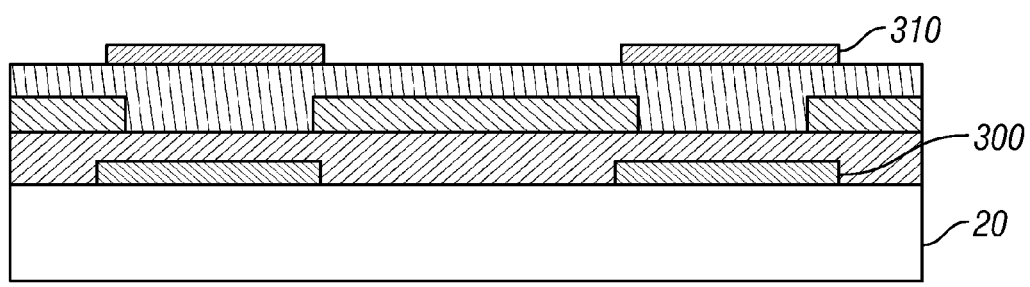

FIGS. 17A-17K are cross-sectional views of a portion of an interferometric modulator depicting one method of manufacturing in one embodiment. The cross-section is through the portion of the interferometric modulator where black masks and posts are formed, such as depicted by cross-section 11 in FIG. 12. In FIG. 17A, black masks 300 are deposited onto transparent substrate 20 and patterned to hide the posts and grounding plane structures that will later be deposited on substrate 20. Next, in FIG. 17B, a transparent dielectric layer 304 is deposited to isolate the black masks from the rest of the structure. In FIG. 17C, the top electrode 306 (referred to as "top" because it is closest to the viewing side of the interferometric modulator although the viewing side is on the bottom of each of FIGS. 17A-K) is deposited and patterned followed by deposition of another transparent dielectric layer 308. As noted above, the top electrode 306 may actually include several layers, including a transparent electrode (e.g. indium tin oxide (ITO)) and a partially reflective layer (e.g. chromium). The top electrode 306 is patterned to create separate (e.g. rectangular) regions for each interferometric modulator as well as to isolate the top electrode 306 from the region where the posts and grounding planes will be formed. In operation, the transparent dielectric layer 304 functions to insulate the top electrode 306 from the movable reflective layer 14 and grounding planes as well as defines the distance between the movable reflective layer 14 and the partially reflective layer in the top electrode 306 when the movable reflective layer 14 is in the up state. The top electrode 306 and dielectric layer 308 may collectively be referred to as the optical stack 16. Next, in FIG. 17D, the upper grounding planes 310 are deposited and patterned. The upper grounding planes 310 may be constructed of any suitable conductor (e.g. aluminum, nickel, gold, silver). As depicted in FIG. 17D, the black masks 300 optically occludes at least a portion of the upper grounding planes 310 from view through the substrate 20.

Figure 17E:
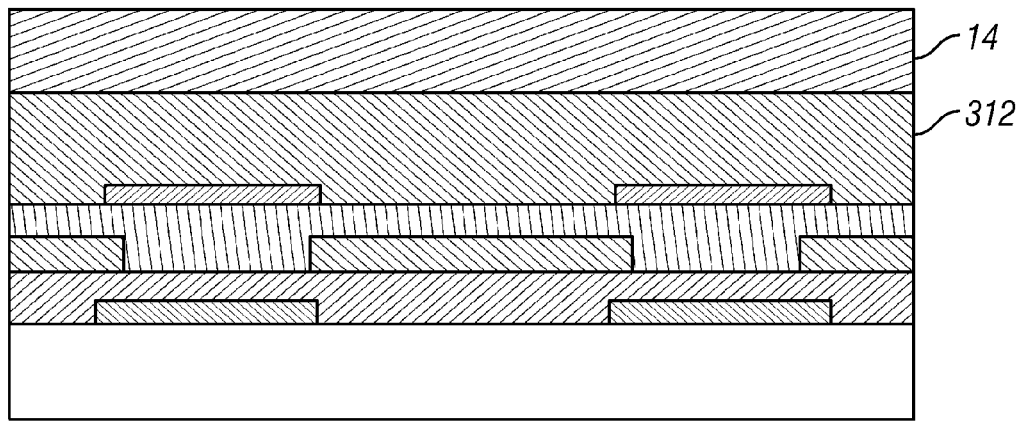
Figure 17F:
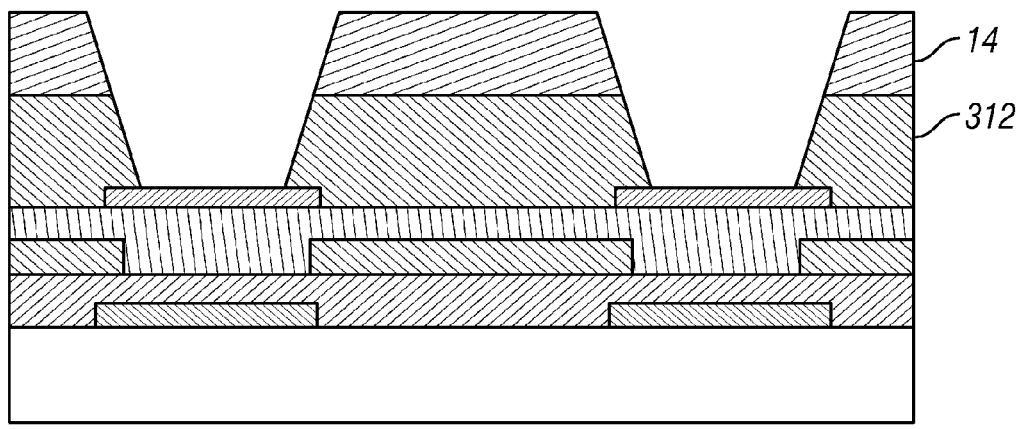

In FIG. 17E, a first sacrificial layer 312 is deposited, followed by deposition of the movable reflective layer 14. The sacrificial layer 312 and movable reflective layer 14 are then patterned in FIG. 17F to form post holes for later formation of posts and to form individual rectangular regions for each interferometric modulator. Next in FIG. 17G, a second sacrificial layer 314 is deposited and patterned. The deposition of the second sacrificial layer 314 results in each region of the movable reflective layer 14 being completely surrounded by sacrificial material. The second sacrificial layer 314 is patterned so that at least a portion of the upper grounding planes 310 is exposed.

Figure 17G:
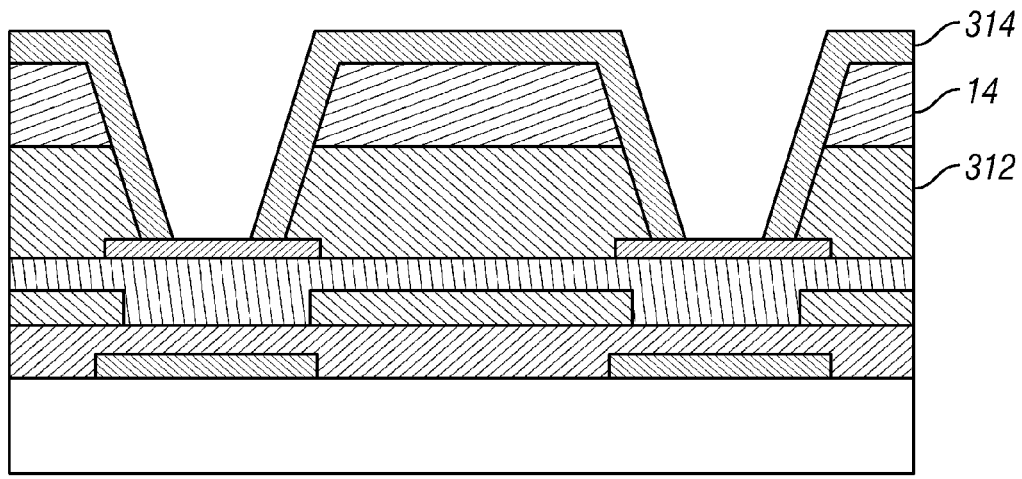
Figure 17H:
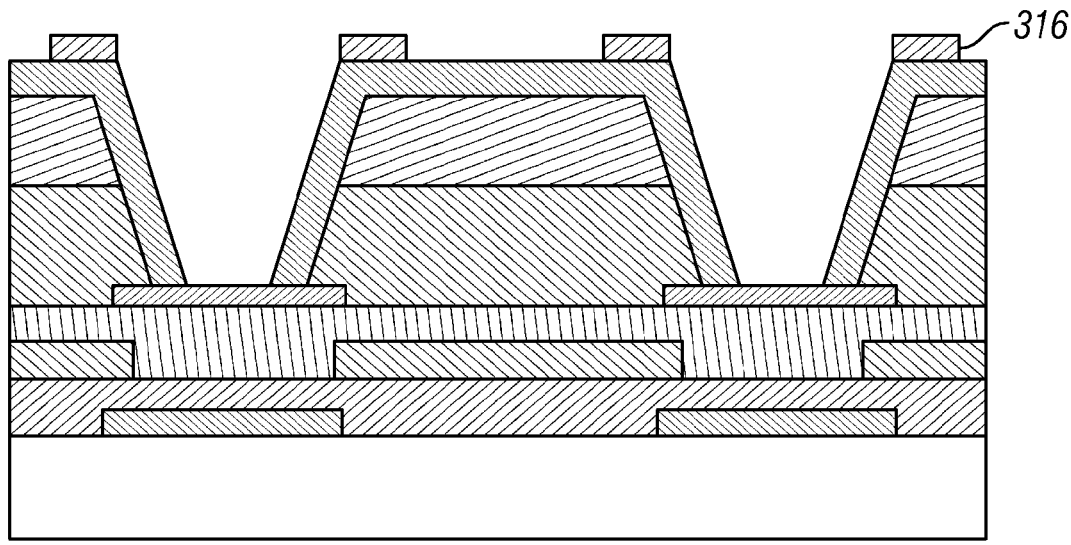
Figure 17I:
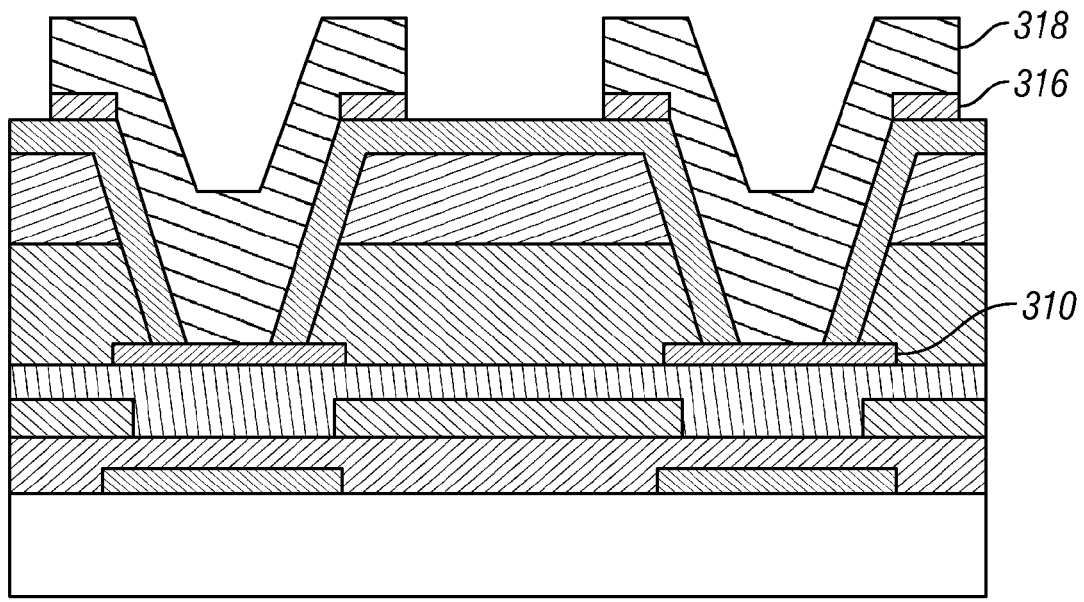
Figure 17J:
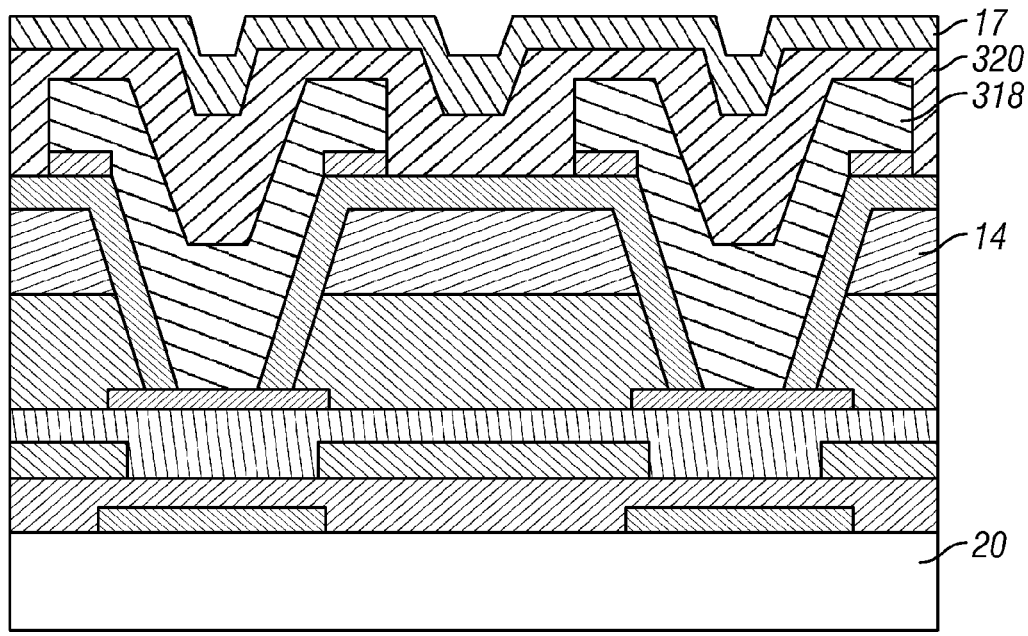
Figure 17K:
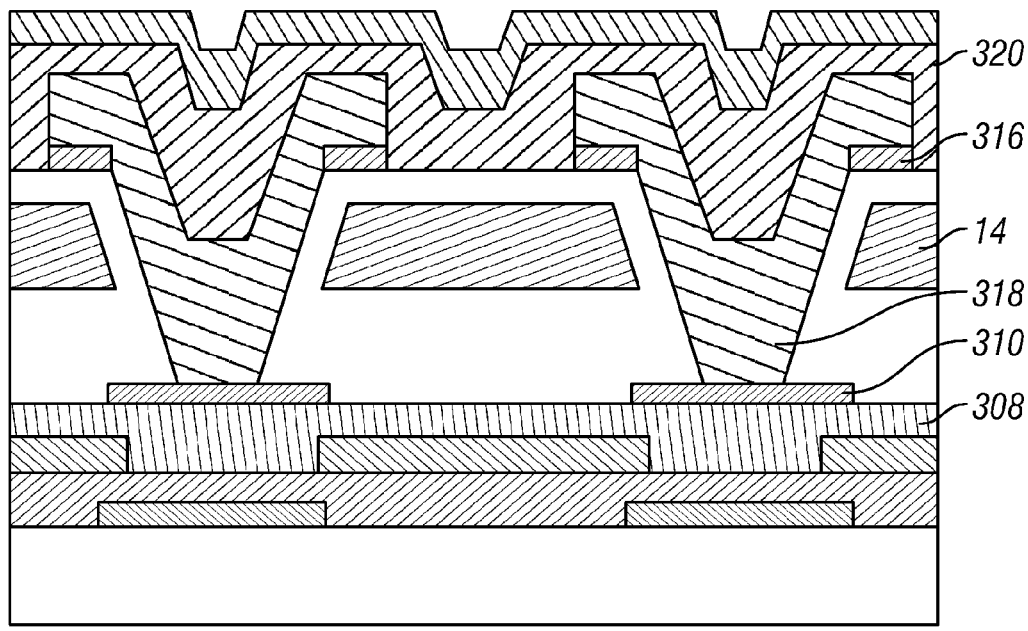

In FIG. 17H, bottom grounding planes 316 are deposited and patterned, followed by deposition and patterning of the posts 318 in FIG. 17I. The posts 318 may be formed of suitable material (e.g., SiO2, SiN, etc.) sufficient to support the bottom electrode. In one embodiment, the posts 318 are formed from a plurality of materials. For example, in one embodiment, the posts 318 comprise in inner portion and an outer portion that partially or completely covers the inner portion. In one embodiment, the inner portion provides the bulk of the structural support and comprises a dielectric (e.g., SiO2, SiN, etc.) while the outer portion comprises a thin conductive layer. To electrically isolate the bottom electrode 17 from the top and bottom grounding planes 310 and 316, the posts 318 may be formed of a dielectric material. In FIG. 17J, the bottom dielectric layer 320 and bottom electrode material 17 are deposited and patterned. In operation, the bottom dielectric layer 320 electrically insulates the bottom electrode 17 from the movable reflective layer 14. In addition, the position of the bottom dielectric layer 320 determines the spacing of the movable reflective layer 14 relative to the optical stack 16 and hence the optical properties of the interferometric modulator when the movable reflective layer 14 is in the down state. As discussed above, in some embodiments, the combination of the bottom electrode 17 and bottom dielectric layer 320 is rigid enough to be independently supported by the posts 318 without substantial deformation upon application of driving potentials. In other embodiments, a second substrate (not shown) is deposited over the bottom electrode 17 to provide additional structural support. The second substrate may in turn be structurally supported by directly coupling it to the first substrate 20, such as through adhesives applied around the perimeter of the entire interferometric modulator array. In alternative manufacturing schemes, the bottom electrode 17 and/or bottom dielectric layer 320 can be formed on the second substrate, and the second substrate can be bonded to the substrate 20.

Finally, in FIG. 17J, the interferometric modulator array is exposed to a release etchant (e.g., XeF2) that removes the first and second sacrificial layers 312 and 314. As a result, the movable reflective layer 14 becomes mechanically isolated from the rest of the interferometric modulator structure. In embodiments in which the movable reflective layer 14 includes apertures 102 as described with respect to FIGS. 11 and 12, removing the first and second sacrificial layers 312 and 314 frees the movable reflective layer 14 to slide over the posts 318 between the down state, where it contacts the bottom dielectric layer 320 and bottom grounding planes 316, and the up state, where it contacts the top dielectric layer 308 and top grounding planes 310.

Figure 18A:
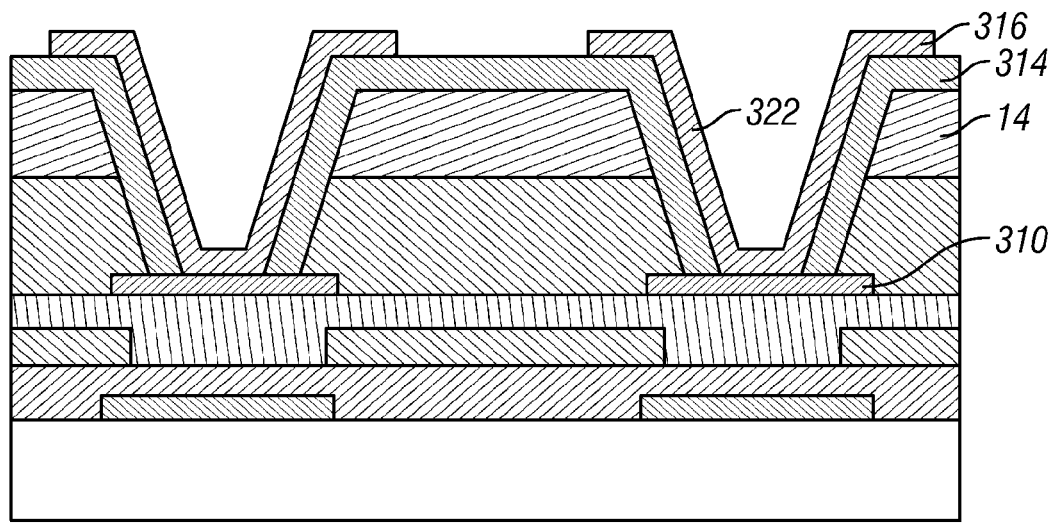
FIGS. 18A-18C are cross-sectional views depicting an alternative embodiment of manufacturing steps for the manufacture of an interferometric modulator utilizing a mechanically isolated movable reflective layer and guide posts.
Figure 18B:
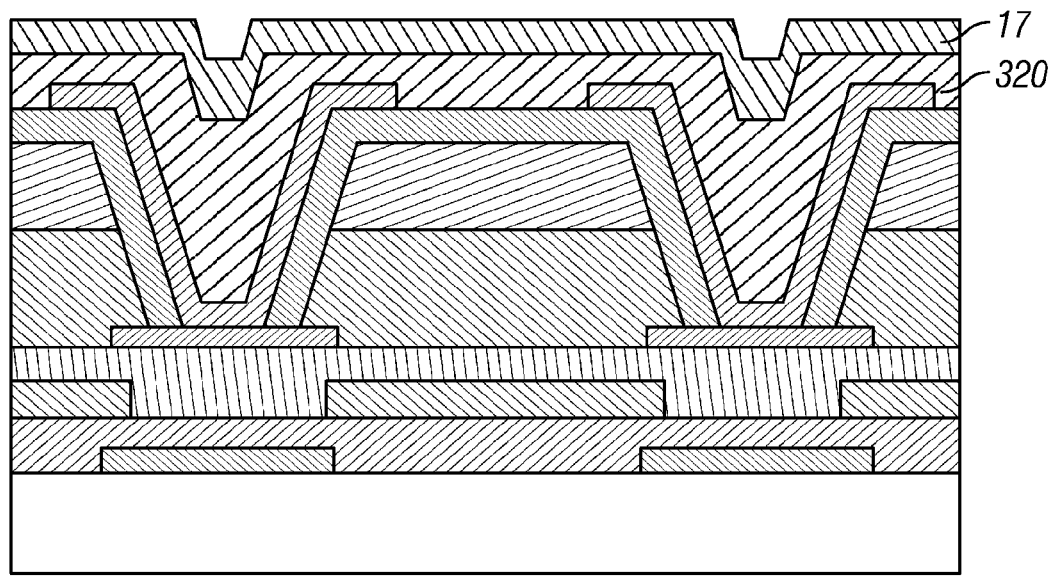
Figure 18C:
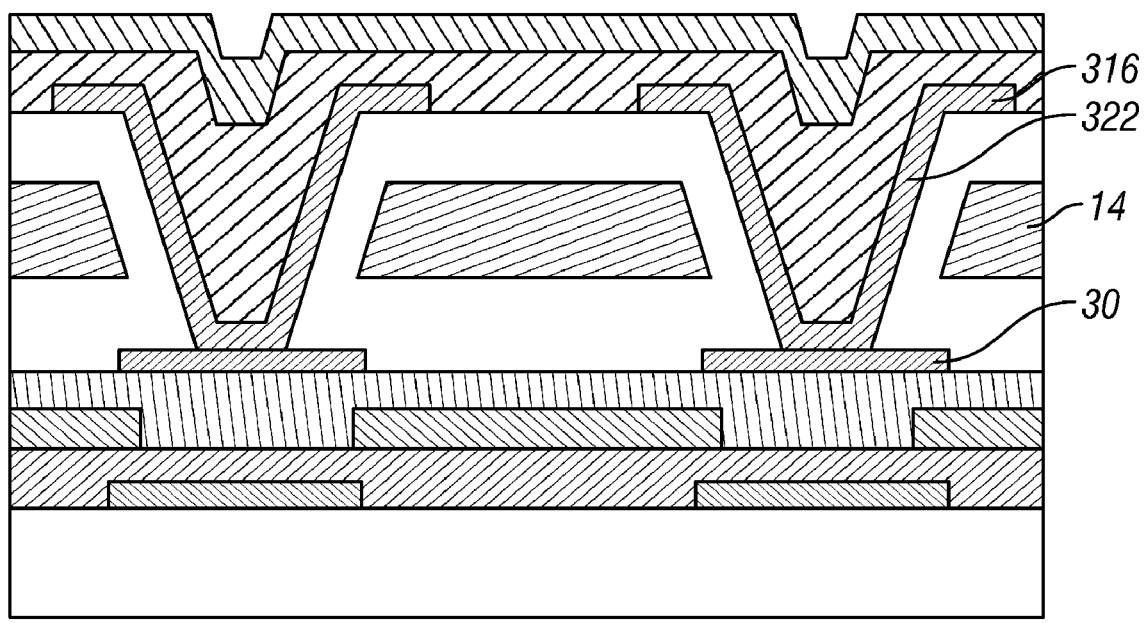

FIGS. 18A-18C are cross-sectional views depicting alternative manufacturing steps for forming conductive posts in one embodiment. After depositing the second sacrificial layer 314 as depicted in FIG. 17G, conductive material may be deposited and patterned to form conductive posts 322. Alternatively, the conductive posts 322 may be formed by depositing and patterning one or more inner non-conductive portions and one or more outer conductive portions. The conductive posts 322 electrically contact the top grounding planes 310 and may be patterned to also form the bottom grounding planes 316. In addition to simplifying electrical contact of the top and bottom grounding planes 310 and 316 to the same ground terminal, this configuration may also provide grounding of the movable reflective layer 14 as it slides over the conductive posts 322 between up and down states. In FIG. 18A, bottom dielectric layer 320 and bottom electrode 17 are deposited and patterned as in FIG. 17J. Finally, as depicted in FIG. 18C, the sacrificial layers are removed using a release etchant. The movable reflective layer 14 is free to electrically contact the top grounding planes 310, the bottom grounding planes 316, and the conductive posts 322.

Although the invention has been described with reference to embodiments and examples, it should be understood that numerous and various modifications can be made without departing from the spirit of the invention. Components and/or elements may be added, removed, or rearranged. Additionally, processing steps may be added, removed, or reordered. While only a few embodiments have been explicitly described, other embodiments will become apparent to those in the art based on this disclosure. Therefore, the scope of the invention is intended to be defined by reference to the appended claims and not simply with regard to the explicitly described embodiments.

What is claimed is:

1. An electromechanical device, comprising:
   a first electrode;
   a second electrode, wherein a gap is present between the first and second electrodes; and
   a mechanically isolated electrically attractable member positioned within the gap, wherein the electrically attractable member is movable within the gap between a first position closer to the first electrode than the second electrode and a second position closer to the second electrode than the first electrode, wherein the first electrode and electrically attractable member form an interferometric modulator.

2. The electromechanical device of claim 1, comprising a charge transfer element configured to change a charge of the electrically attractable member.

3. The electromechanical device of claim 2, wherein the charge transfer element comprises one or more electrical contacts.

4. The electromechanical device of claim 3, wherein the electrically attractable member does not contact the one or more electrical contacts at a third position between the first and second electrodes.

5. The electromechanical device of claim 3, where the charge transfer element comprises at least one electrical contact positioned to contact the electrically attractable member when it is in the first position, and at least one other electrical contact positioned to contact the electrically attractable member when it is in the second position.

6. The electromechanical device of claim 2, wherein the charge transfer element comprises an electrically conductive coupling connecting the electrically attractable member to a driving circuit.

7. The electromechanical device of claim 2, wherein the charge transfer element comprises a conductive post along which the electrically attractable member is configured to move.

8. The electromechanical device of claim 1, wherein the electrically attractable member is charged.

9. The electromechanical device of claim 1, comprising a post positioned within the gap, wherein the electrically attractable member comprises an opening through which the post extends.

10. The electromechanical device of claim 1, wherein at least one surface of the electrically attractable member is substantially reflective.

11. The electromechanical device of claim 1, wherein the first electrode is partially reflective.

12. The electromechanical device of claim 1, comprising a third electrode coplanar with the first electrode and a fourth electrode coplanar with the second electrode, wherein the first and second electrodes are positioned to overlap with a substantial portion of a first portion of the electrically attractable member and the third and fourth electrodes are positioned to overlap with a substantial portion of a second portion of the electrically attractable member.

13. A display, comprising an array of electromechanical devices that comprise:
   a first electrode;
   a second electrode, wherein a gap is present between the first and second electrodes; and
   a mechanically isolated electrically attractable member positioned within the gap, wherein the electrically attractable member is movable within the gap between a first position closer to the first electrode than the second electrode and a second position closer to the second electrode than the first electrode.

14. The display of claim 13, further comprising:
- a processor that is in electrical communication with the array of electromechanical devices, said processor being configured to process image data; and
- a memory device in electrical communication with said processor.

15. The display of claim 14, further comprising:
- a first controller configured to send at least one signal to the array of electromechanical devices; and
- a second controller configured to send at least a portion of said image data to said first controller.

16. The display of claim 14, further comprising an image source module configured to send said image data to said processor.

17. The display of claim 16, wherein said image source module comprises at least one of a receiver, transceiver, and transmitter.

18. The display of claim 14, further comprising an input device configured to receive input data and to communicate said input data to said processor.

19. An electromechanical device, comprising:
- a first electrode, wherein the first electrode is partially reflective;
- a second electrode, wherein a gap is present between the first and second electrodes; and
- a mechanically isolated electrically attractable member positioned within the gap, wherein the electrically attractable member is movable within the gap between a first position closer to the first electrode than the second electrode and a second position closer to the second electrode than the first electrode.

20. The electromechanical device of claim 19, comprising a charge transfer element configured to change a charge of the electrically attractable member.

21. The electromechanical device of claim 20, wherein the charge transfer element comprises one or more electrical contacts.

22. The electromechanical device of claim 21, wherein the electrically attractable member does not contact the one or more electrical contacts at a third position between the first and second electrodes.

23. The electromechanical device of claim 21, where the charge transfer element comprises at least one electrical contact positioned to contact the electrically attractable member when it is in the first position, and at least one other electrical contact positioned to contact the electrically attractable member when it is in the second position.

24. The electromechanical device of claim 20, wherein the charge transfer element comprises an electrically conductive coupling connecting the electrically attractable member to a driving circuit.

25. The electromechanical device of claim 20, wherein the charge transfer element comprises a conductive post along which the electrically attractable member is configured to move.

26. The electromechanical device of claim 19, wherein electrically attractable member is charged.

27. The electromechanical device of claim 19, comprising a post positioned within the gap, wherein the electrically attractable member comprises an opening through which the post extends.

28. The electromechanical device of claim 19, wherein at least one surface of the electrically attractable member is substantially reflective.

29. The electromechanical device of claim 19, comprising a third electrode coplanar with the first electrode and a fourth electrode coplanar with the second electrode, wherein the first and second electrodes are positioned to overlap with a substantial portion of a first portion of the electrically attractable member and the third and fourth electrodes are positioned to overlap with a substantial portion of a second portion of the electrically attractable member.

30. An electromechanical device, comprising:
- a first electrode;
- a second electrode, wherein a gap is present between the first and second electrodes;
- a mechanically isolated electrically attractable member positioned within the gap, wherein the electrically attractable member is movable within the gap between a first position closer to the first electrode than the second electrode and a second position closer to the second electrode than the first electrode; and
- a charge transfer element configured to change a charge of the electrically attractable member, wherein the charge transfer element comprises a conductive post along which the electrically attractable member is configured to move.

31. The electromechanical device of claim 30, wherein the electrically attractable member is charged.

32. The electromechanical device of claim 30, wherein at least one surface of the electrically attractable member is substantially reflective.

33. The electromechanical device of claim 30, comprising a third electrode coplanar with the first electrode and a fourth electrode coplanar with the second electrode, wherein the first and second electrodes are positioned to overlap with a substantial portion of a first portion of the electrically attractable member and the third and fourth electrodes are positioned to overlap with a substantial portion of a second portion of the electrically attractable member.

34. An electromechanical device, comprising:
- a first electrode;
- a second electrode, wherein a gap is present between the first and second electrodes;
- a mechanically isolated electrically attractable member positioned within the gap, wherein the electrically attractable member is movable within the gap between a first position closer to the first electrode than the second electrode and a second position closer to the second electrode than the first electrode; and
- a post positioned within the gap, wherein the electrically attractable member comprises an opening through which the post extends.

35. The electromechanical device of claim 34, comprising a charge transfer element configured to change a charge of the electrically attractable member.

36. The electromechanical device of claim 35, wherein the charge transfer element comprises one or more electrical contacts.

37. The electromechanical device of claim 36, wherein the electrically attractable member does not contact the one or more electrical contacts at a third position between the first and second electrodes.

38. The electromechanical device of claim 36, where the charge transfer element comprises at least one electrical contact positioned to contact the electrically attractable member when it is in the first position, and at least one other electrical contact positioned to contact the electrically attractable member when it is in the second position.

39. The electromechanical device of claim 35, wherein the charge transfer element comprises an electrically conductive coupling connecting the electrically attractable member to a driving circuit.

40. The electromechanical device of claim 35, wherein the charge transfer element comprises a conductive post along which the electrically attractable member is configured to move.

41. The electromechanical device of claim 34, wherein the electrically attractable member is charged.

42. The electromechanical device of claim 34, wherein at least one surface of the electrically attractable member is substantially reflective.

43. The electromechanical device of claim 34, comprising a third electrode coplanar with the first electrode and a fourth electrode coplanar with the second electrode, wherein the first and second electrodes are positioned to overlap with a substantial portion of a first portion of the electrically attractable member and the third and fourth electrodes are positioned to overlap with a substantial portion of a second portion of the electrically attractable member.

* * * * *